US011839128B2

(12) United States Patent
Choe

(10) Patent No.: US 11,839,128 B2
(45) Date of Patent: Dec. 5, 2023

(54) DISPLAY DEVICE

(71) Applicant: Samsung Display Co., Ltd., Yongin-si (KR)

(72) Inventor: Wonkyu Choe, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 197 days.

(21) Appl. No.: 16/881,508

(22) Filed: May 22, 2020

(65) Prior Publication Data

US 2020/0381484 A1 Dec. 3, 2020

(30) Foreign Application Priority Data

May 30, 2019 (KR) .................. 10-2019-0064024

(51) Int. Cl.
| | |
|---|---|
| H01L 51/52 | (2006.01) |
| H10K 59/38 | (2023.01) |
| H10K 50/844 | (2023.01) |
| H10K 50/854 | (2023.01) |
| H10K 50/858 | (2023.01) |
| H10K 59/122 | (2023.01) |
| H10K 102/00 | (2023.01) |

(52) U.S. Cl.
CPC ........... *H10K 59/38* (2023.02); *H10K 50/844* (2023.02); *H10K 50/854* (2023.02); *H10K 50/858* (2023.02); *H10K 59/122* (2023.02); *H10K 2102/331* (2023.02)

(58) Field of Classification Search
CPC .............. H01L 27/322; H01L 51/5268; H01L 51/5275; H10K 59/38; H10K 50/854; H10K 50/858

See application file for complete search history.

(56) References Cited

U.S. PATENT DOCUMENTS 9,064,822 B2  6/2015  Park et al.
9,720,149 B2  8/2017  Wu et al.
(Continued)

FOREIGN PATENT DOCUMENTS

JP    2005-302313 A    10/2005
JP    2015128027 A  *   7/2015
(Continued)

*Primary Examiner* — Michele Fan
(74) *Attorney, Agent, or Firm* — Lewis Roca Rothgerber Christie LLP

(57) ABSTRACT

A display device includes a light emitting element layer including a plurality of light emitting elements configured to output first color light, a color conversion layer on the light emitting element layer to receive the first color light, the color conversion layer being configured to convert the first color light so as to output at least two lights having colors different from each other, and a light collection layer between the light emitting element layer and the color conversion layer to collect the first color light, thereby providing the collected first color light to the color conversion layer. The light collection layer that collects the first color light may be disposed between the color conversion layer and the light emitting element layer to improve the light efficiency of the first color light outputted from the light emitting element layer, and also to prevent (or reduce) the colors from being mixed between the pixel areas, thereby improving the display quality.

19 Claims, 14 Drawing Sheets

(56) References Cited

U.S. PATENT DOCUMENTS

| | | | |
|---|---|---|---|
| 10,281,767 B2 | 5/2019 | Yoon et al. | |
| 10,312,303 B2 | 6/2019 | Kwon et al. | |
| 2008/0272690 A1 | 11/2008 | Kuma et al. | |
| 2010/0188613 A1* | 7/2010 | Tsukahara | G02B 6/0023 264/21 |
| 2012/0274882 A1 | 11/2012 | Jung | |
| 2014/0192294 A1* | 7/2014 | Chen | G02F 1/133514 349/69 |
| 2015/0028739 A1* | 1/2015 | Kwon | H01L 51/5271 313/512 |
| 2015/0102291 A1* | 4/2015 | Park | H01L 27/3276 257/40 |
| 2015/0228697 A1 | 8/2015 | Liu et al. | |
| 2018/0012940 A1* | 1/2018 | Park | H01L 51/5275 |
| 2018/0122836 A1* | 5/2018 | Kang | H01L 33/54 |
| 2018/0224698 A1 | 8/2018 | Qi et al. | |
| 2019/0121194 A1* | 4/2019 | Park | G02F 1/1343 |
| 2019/0212610 A1 | 7/2019 | Kim et al. | |
| 2019/0371866 A1* | 12/2019 | Kim | H01L 27/322 |
| 2021/0020865 A1* | 1/2021 | Kim | H01L 51/5072 |

FOREIGN PATENT DOCUMENTS

| | | | |
|---|---|---|---|
| JP | 2017-156412 A | | 9/2017 |
| KR | 10-1177480 B1 | | 8/2012 |
| KR | 10-2015-0012520 A | | 2/2015 |
| KR | 20160076346 A | * | 6/2016 |
| KR | 10-2017-0096583 A | | 8/2017 |
| KR | 10-2018-0092326 A | | 8/2018 |
| KR | 10-2018-0114979 A | | 10/2018 |

* cited by examiner

DISPLAY DEVICE

CROSS-REFERENCE TO RELATED APPLICATION

This application claims priority to and the benefit of Korean Patent Application No. 10-2019-0064024, filed on May 30, 2019, the entire content of which is hereby incorporated by reference.

BACKGROUND

1. Field

One or more aspects of embodiments of the present disclosure herein are directed to a display device, and more particularly, to a display device having improved display quality.

2. Description of the Related Art

Various display devices for providing image information in multimedia devices, such as televisions, mobile phones, table computers, navigation devices, and/or game consoles, are being developed. Particularly, in a display device including a liquid crystal display device, an organic electroluminescence device, and/or the like, quantum dots are being introduced to improve display quality.

An organic light emitting layer that outputs light having a specific color may be disposed on a plurality of pixel areas of the organic electroluminescence device, and the quantum dots may be used as a color conversion layer that converts the light having the specific color into light having different colors so as to display colors.

SUMMARY

One or more aspects of embodiments of the present disclosure are directed to a display device that is capable of preventing (or reducing) colors from being mixed between pixel areas that are adjacent to each other.

An embodiment of the present disclosure provides a display device including: a light emitting element layer including a plurality of light emitting elements configured to output first color light; a color conversion layer disposed on the light emitting element layer to receive the first color light, the color conversion layer being configured to convert the first color light so as to output at least two lights having colors different from each other; and a light collection layer disposed between the light emitting element layer and the color conversion layer to collect the first color light, thereby providing the collected first color light to the color conversion layer.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

Figure 1:
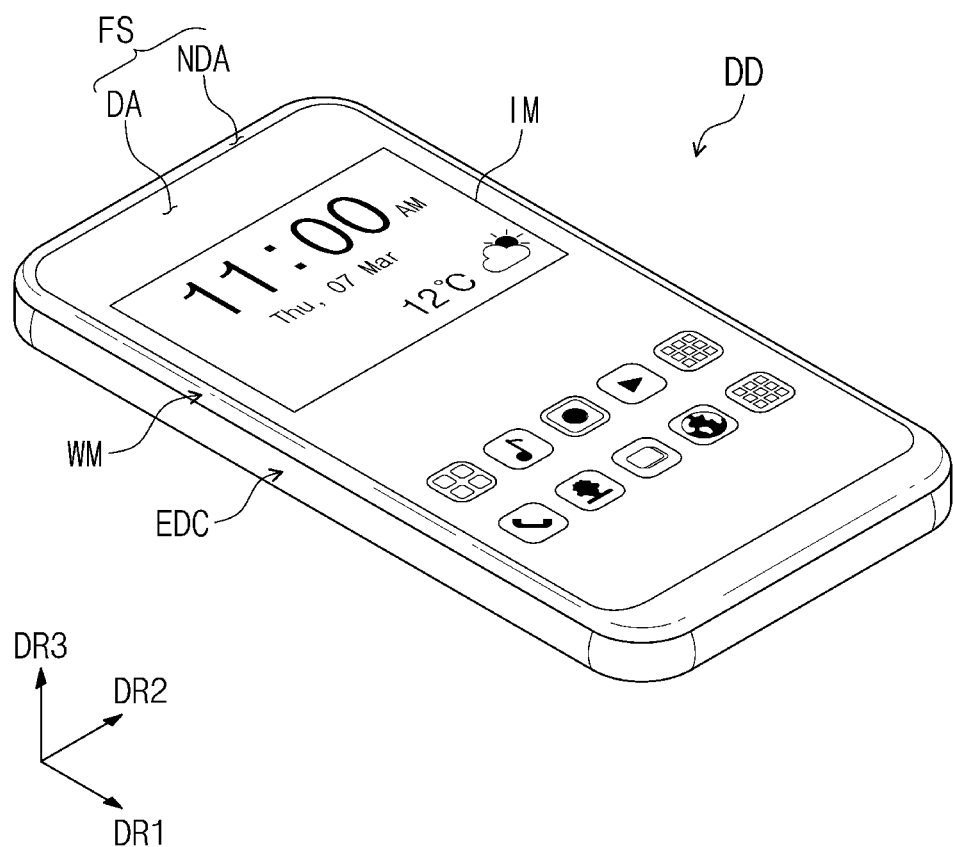
FIG. 1 is a coupling perspective view of a display device according to an embodiment of the present disclosure.

In this specification, it will also be understood that when one component (or region, layer, portion) is referred to as being "on", "connected to", or "coupled to" another component, it can be directly disposed/connected/coupled on/to the one component, or intervening components may also be present.

Like reference numerals refer to like elements throughout. Also, in the figures, the thickness, ratio, and dimensions of components are exaggerated for clarity of illustration.

The term "and/or" includes any and all combinations of one or more of the associated listed items. Further, the use of "may" when describing embodiments of the present invention refers to "one or more embodiments of the present invention."

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present disclosure will be described with reference to the accompanying drawings.

Figure 2:
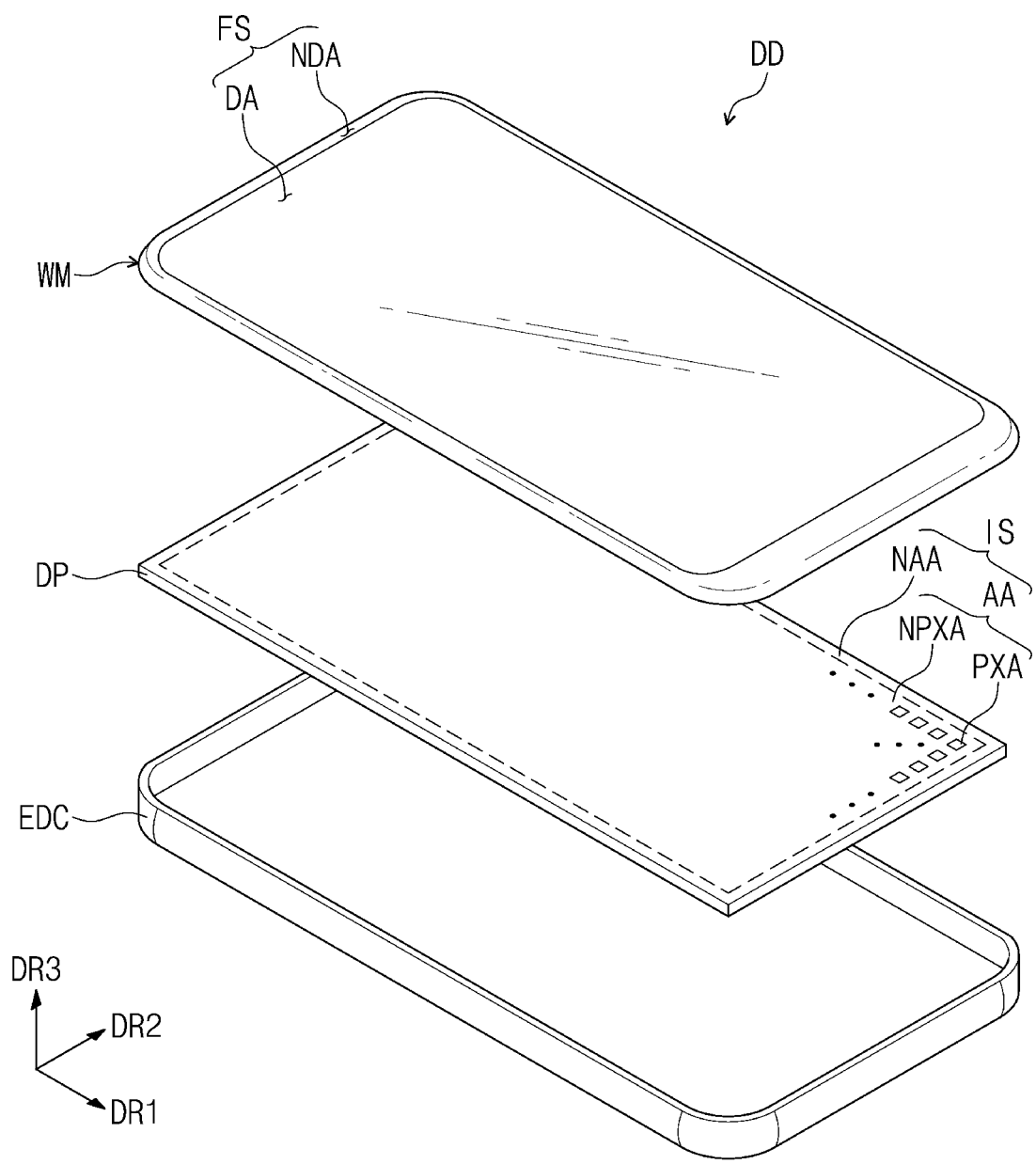
FIG. 2 is an exploded perspective view of the display device according to an embodiment of the present disclosure.

FIG. 1 is a coupling perspective view of a display device according to an embodiment of the present disclosure, and FIG. 2 is an exploded (e.g., disassembled) perspective view of the display device according to an embodiment of the present disclosure.

Referring to FIGS. 1 and 2, a display device DD according to an embodiment of the present disclosure has a rectangular shape with a long side in a first direction DR1 and a short side in a second direction DR2 crossing the first direction DR1. However, the shape of the display device DD is not limited thereto. For example, the display device DD may have various suitable shapes.

The display device DD according to the present disclosure may be used for large-sized display devices, such as televisions, monitors, and/or the like, and small and middle-sized display devices such as mobile phones, tablet PC, navigation units for vehicles, game consoles, and/or the like. The above-described devices are exemplified as merely example embodiments, and the display device DD may be adopted for other electronic equipment so long as such application does not depart from the spirit and scope of the invention.

As illustrated in FIG. 1, the display device DD may display an image IM in a third direction DR3 on a display surface FS that is parallel to a plane defined by the first and second directions DR1 and DR2. The display surface FS on which the image IM is displayed may correspond to a front surface of the display device DD.

The display surface FS of the display device DD may be divided into a plurality of areas. A display area DA and a non-display area NDA may be defined on the display surface FS of the display device DD.

The display area DA may be an area on which an image IM is displayed, and a user may see the image IM through the display area DA. The display area DA may have a rectangular shape. The non-display area NDA may surround the display area DA. Thus, the shape of the display area DA may be substantially defined by the non-display area NDA. However, the embodiment of the present disclosure is merely an example. For example, the non-display area NDA may be disposed adjacent to only one side of the display area DA or may be omitted altogether. The display device DD according to an embodiment of the present disclosure may be implemented according to various embodiments, but is not limited to a specific embodiment.

The non-display area NDA is an area which is adjacent to the display area DA and on which the image IM is not displayed. A bezel area of the display device DD may be defined by the non-display area NDA.

The non-display area NDA may surround the display area DA. However, the embodiment of the present disclosure is merely an example. For example, the non-display area NDA may be disposed adjacent to only a portion of an edge of the display area DA, but is not limited to a specific embodiment.

The display device DD according to the present disclosure may sense a user's input applied from the outside. The user's input includes various suitable external inputs, such as a portion of a user's body, light, heat, a pressure, and/or the like. In the present embodiment, the user's input is illustrated as a user's hand applied to a front surface. However, this is merely an example. As described above, the user's input may be provided in various suitable forms. The display device DD may sense the user's input applied to a side surface or the rear surface of the display device DD according to a structure of the display device DD, but is not limited to a specific embodiment.

The display device DD may activate the display surface FS to display the image IM and also sense an external input. In the present embodiment, an area on which the external input is sensed (received) may be provided on the display area DA on which the image IM is displayed. However, this is merely an example. For example, the area on which the external input is sensed (received) may be provided on the non-display area NDA or provided on an entire area of the display surface FS.

Referring to FIG. 2, the display device DD may include a display panel DP on which an image is displayed and a window WM disposed on the display panel DP.

A top surface of the window WM is defined as the display surface FS of the display device DD. The window WM may be optically transparent. Thus, an image generated in the display panel DP may pass through the window WM and be easily recognized by the user.

The top surface of the window WM may be divided into the display area DA and the non-display area NDA. The display area DA may be an area through which light provided from the display panel DP is transmitted. The non-display area NDA may be an area having a light transmittance that is relatively less than that of the display area DA. The non-display area NDA may define a shape of the display area DA. In the non-display area NDA, the window WM may have a predetermined (or set) color.

The window WM may be made of a flexible material. For example, the window WM may be defined in shape (deformed) together with deformation in shape of the display panel DP (e.g., bending of the display panel DP). The window WM may transmit the image transmitted from the display panel DP (e.g., may allow the image transmitted from the display panel DP to pass through) and also mitigate (or reduce) an external impact to prevent (or reduce) the display panel DP from being damaged or malfunctioned by the external impact. The external impact may refer to a force applied from the outside, which may be expressed as pressure, stress, and/or the like, i.e., force that may cause defects of the display panel DP.

In one or more embodiments, the display panel DP outputs an image through a front surface IS of the display panel DP. The front surface IS may be divided into an active area AA and a peripheral area NAA. The image IM is displayed on the active area AA. The peripheral area NAA is adjacent to the active area AA.

The active area AA of the display panel DP may correspond to the display area DA of the window WM. Thus, the image displayed on the active area AA may be seen from the outside through the display area DA.

The non-display area NDA of the window WM may cover the peripheral area NAA of the display panel DP to prevent (or reduce) the peripheral area NAA from being seen from the outside. For example, when light generated in the display panel DP leaks to the peripheral area NAA, light leaking may be blocked by the non-display area NDA to prevent (or reduce) the peripheral area NAA from being seen from the outside.

The display panel DP may include a plurality of pixels. The plurality of pixels may output light having color (e.g., color information) in response to an electrical signal to display an image on the active area AA. The active area AA may be divided into a plurality of pixel areas PXA corresponding to the plurality of pixels and a non-pixel area NPXA adjacent to the plurality of pixel areas PXA.

The display panel DP may be a flexible display panel. For example, the display panel DP may be an organic light emitting display panel.

A cover case EDC is disposed (e.g., positioned) on a rear surface of the display device DD. The cover case EDC may be coupled to the window WM to provide an inner space. The display panel DP and circuit components, a camera module, and/or power modules, which are coupled to the display panel DP, may be accommodated in the inner space. The cover case EDC may include a material having predetermined (or set) rigidity. For example, the cover case EDC may include a plurality of frames and/or plates, which are made of glass, plastic, and/or a metal. The cover case EDC may stably (or suitably) protect the constituents (components) of the display device DD, which are accommodated in the inner space, against the external impact.

Figure 3:
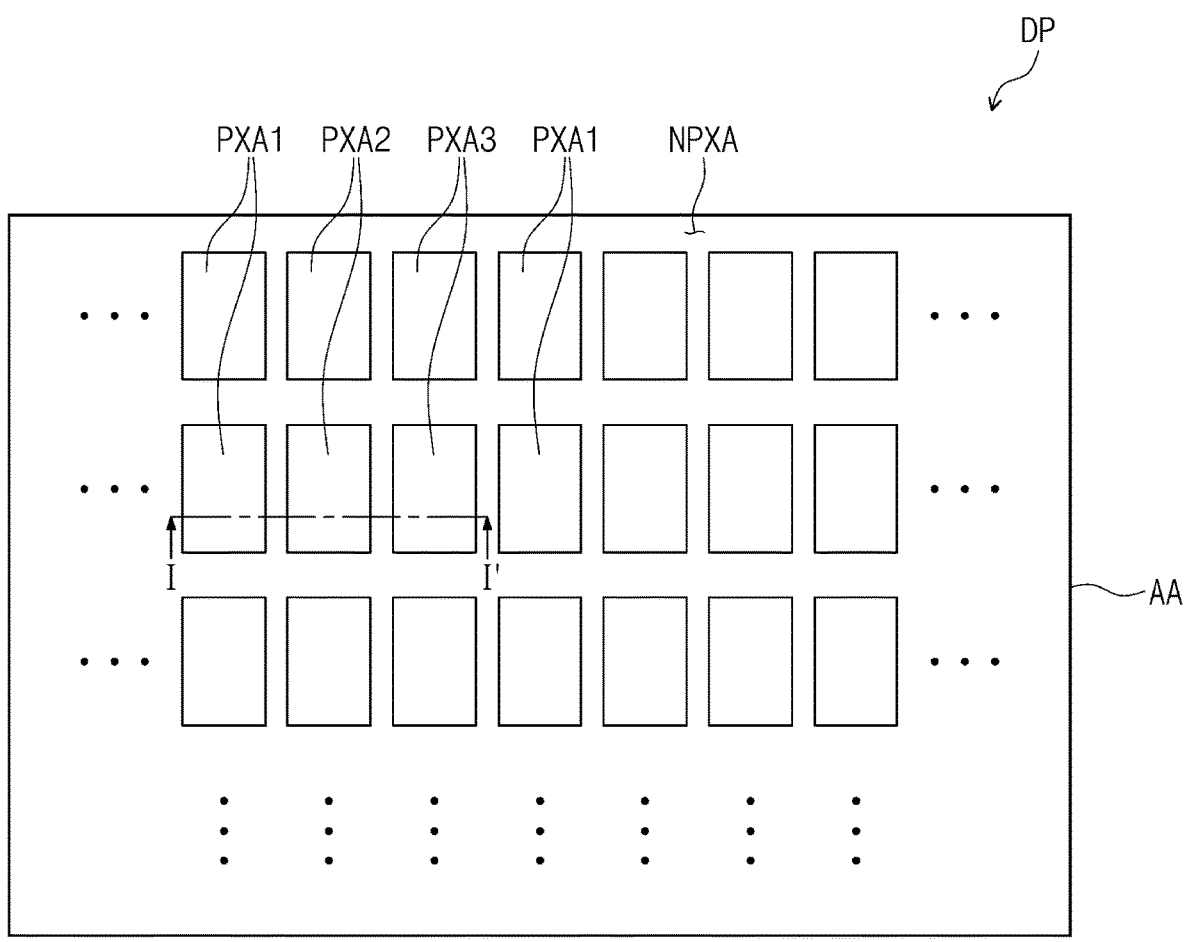
FIG. 3 is a plan view of a display panel according to an embodiment of the present disclosure.
Figure 3:
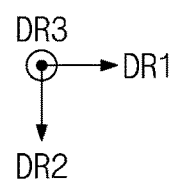
Figure 4:
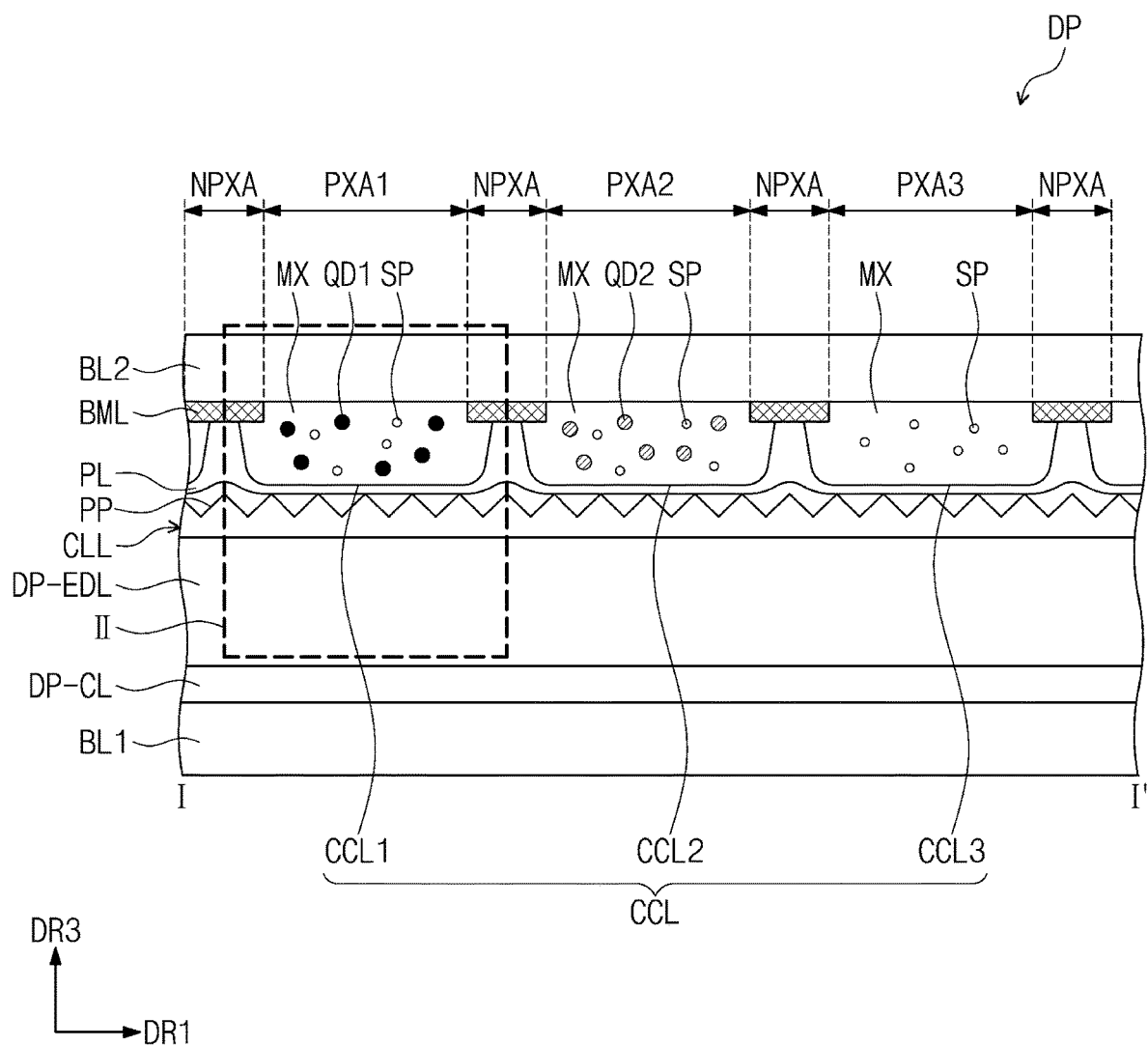
FIG. 4 is a cross-sectional view of the display panel, taken along line I-I' of FIG. 3.
Figure 5:
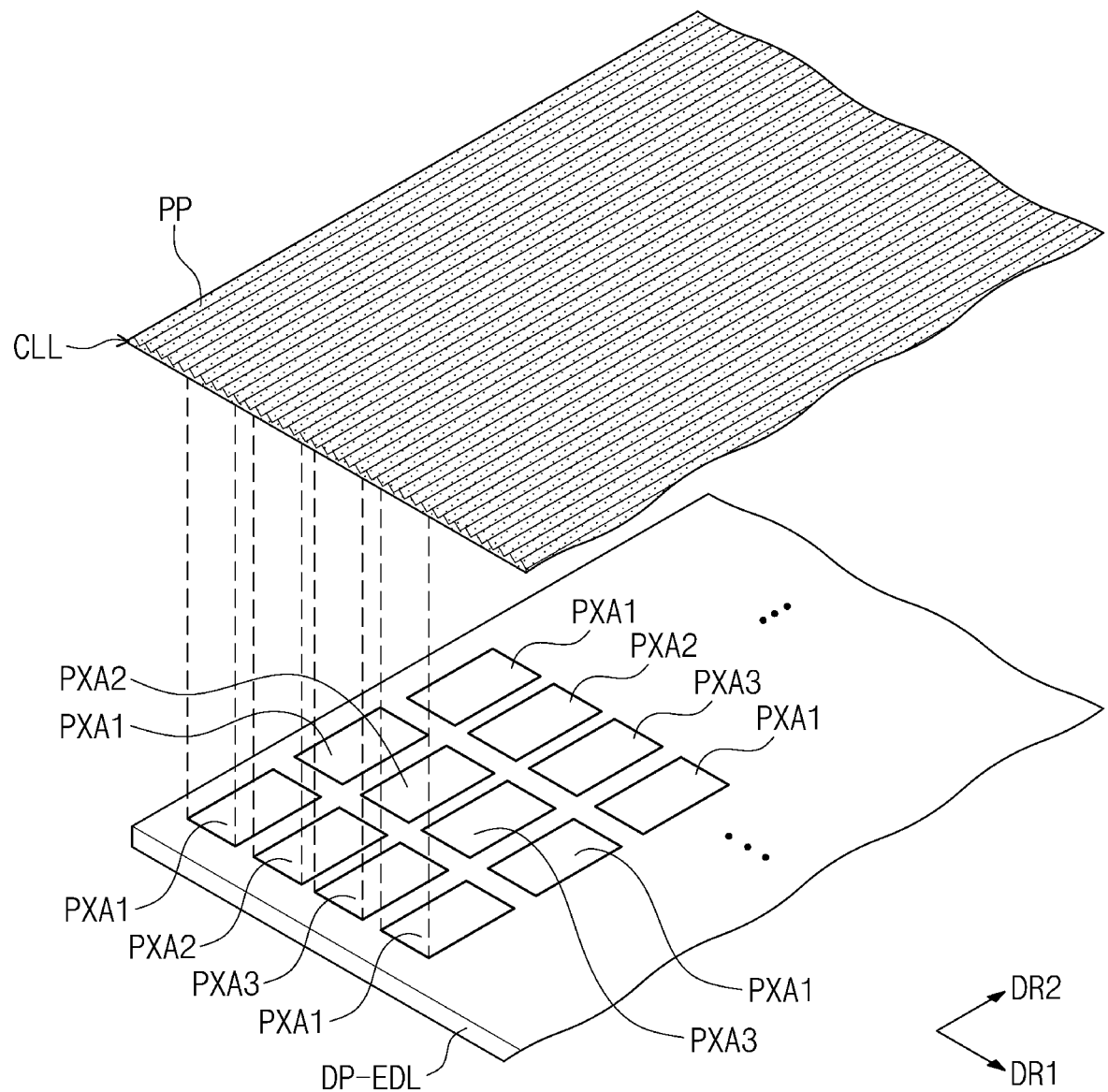
FIG. 5 is an exploded perspective view of a light emitting element layer and a light collection layer of FIG. 4.
Figure 6:
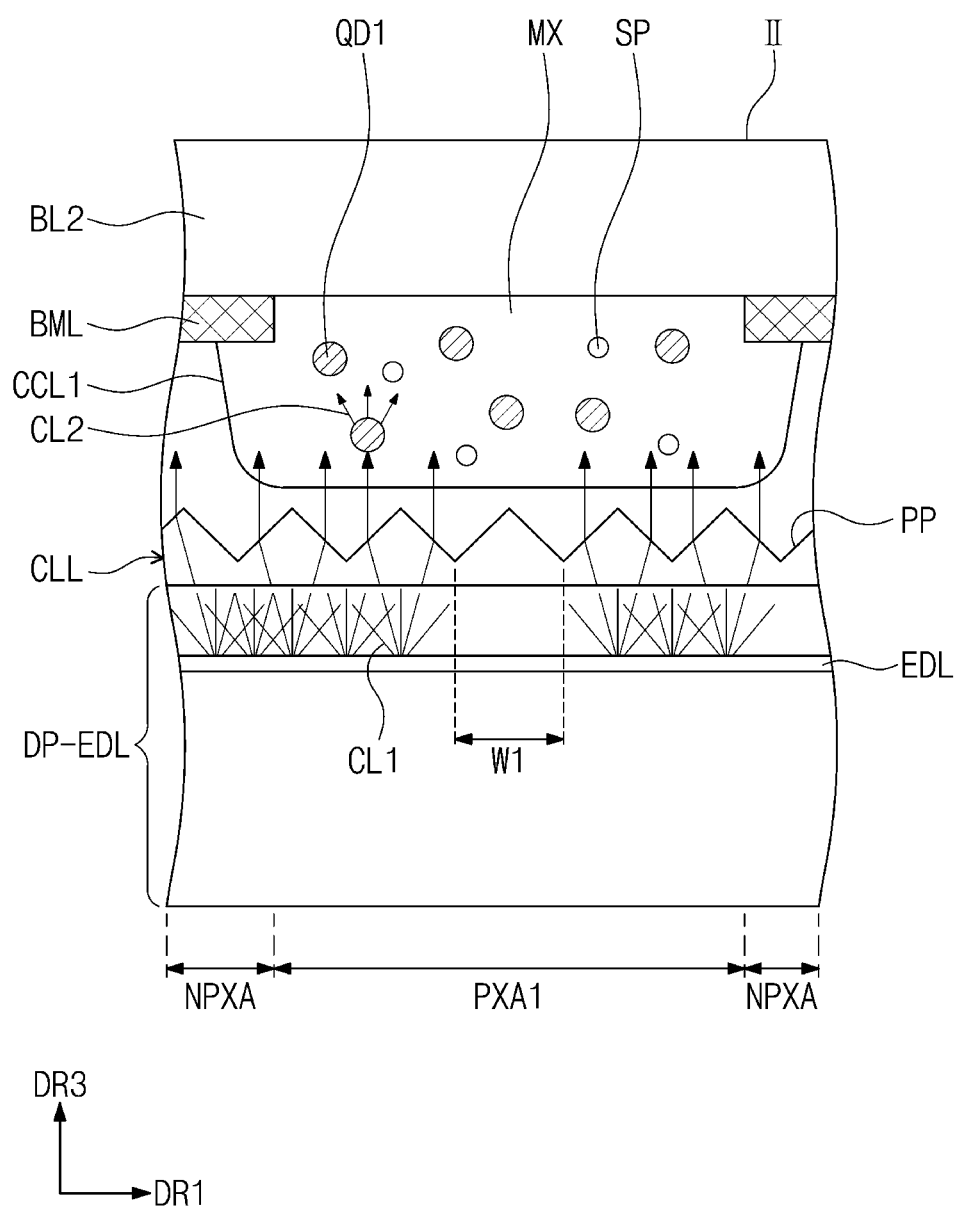
FIG. 6 is an enlarged cross-sectional view of a portion II of FIG. 4.

FIG. 3 is a plan view of the display panel according to an embodiment of the present disclosure, FIG. 4 is a cross-sectional view of the display panel, taken along line I-I' of FIG. 3, FIG. 5 is an exploded perspective view of the light emitting element layer and the light collection layer of FIG. 4, and FIG. 6 is an enlarged cross-sectional view of a portion II of FIG. 4.

Referring to FIG. 3, first pixel areas PXA1, second pixel areas PXA2, third pixel areas PXA3, and a non-pixel area NPXA may be defined on the active area AA of the display panel DP. The first pixel areas PXA1 may provide second color light, the second pixel areas PXA2 may provide third color light, and the third pixel areas PXA3 may provide first color light. The first color light, the second color light, and the third color light may have colors different from each other. For example, one of the first to third color light may be blue light, the other may be red light, the rest may be green light.

The first pixel areas PXA1 may be arranged in the second direction DR2, the second pixel areas PXA2 may be arranged in the second direction DR2, and the third pixel areas PXA3 may be arranged in the second direction DR2. The first pixel areas PXA1, the second pixel areas PXA2, and the third pixel areas PXA3 may be alternately arranged in the first direction DR1. For example, the second pixel areas PXA2 may be disposed adjacent to the first pixel areas PXA1 in the first direction DR1, and the third pixel areas PXA3 may be disposed adjacent to the second pixel areas PXA2 in the first direction DR1. However, the arrangement of the first to third pixel areas PXA1, PXA2, and PXA3 is not limited to the embodiment illustrated in FIG. 3.

The non-pixel area NPXA may be an area that is disposed adjacent to the first pixel areas PXA1, the second pixel areas PXA2, and the third pixel areas PXA3. The non-pixel area NPXA may define boundaries between the first pixel areas PXA1, the second pixel areas PXA2, and the third pixel areas PXA3. The non-pixel area NPXA may prevent (or reduce) colors from being mixed between the first pixel areas PXA1, the second pixel areas PXA2, and the third pixel areas PXA3.

Referring to FIG. 4, the display panel DP may include a first base layer BL1, a display circuit layer DP-CL, a light emitting element layer DP-EDL, and a light collection layer CLL. In an embodiment, the first base layer BL1, the display circuit layer DP-CL, and the light emitting element layer DP-EDL may be sequentially laminated in the third direction DR3.

The first base layer BL1 may be a member that provides a base surface on which the display circuit layer DP-CL is disposed. The first base layer BL1 may be a glass substrate, a metal substrate, and/or a plastic substrate. However, the embodiment of the present disclosure is not limited thereto. For example, the first base layer BL1 may be an inorganic layer, an organic layer, or a composite layer.

The display circuit layer DP-CL may be disposed on the first base layer BL1. The display circuit layer DP-CL may include a plurality of transistors. The transistors may include a control electrode, an input electrode, and an output electrode, respectively. For example, the display circuit layer DP-CL may include a switching transistor and a driving transistor, which are configured to drive an organic electroluminescent element.

The light emitting element layer DP-EDL may be disposed on the display circuit layer DP-CL. The light emitting element layer DP-EDL may include a plurality of organic electroluminescent elements and an encapsulation layer covering the plurality of organic electroluminescent elements. The light emitting element layer DP-EDL may include a light emitting layer EML (see FIG. 11) that outputs first color light. The first color light may be blue light. The light emitting layer EML may be a common layer that is commonly provided in the plurality of organic electroluminescent elements. That is, the plurality of organic electroluminescent elements may commonly output the first color light through the light emitting layer EML.

The light emitting element layer DP-EDL and the display circuit layer DP-CL will be described below in more detail with reference to FIGS. 10 and 11.

Referring to FIGS. 4 and 5, the light collection layer CLL may be disposed on the light emitting element layer DP-EDL. The light collection layer CLL includes a plurality of prism patterns PP. In FIG. 5, for convenience of description, some pixel areas PXA1, PXA2, and PXA3 of the pixel areas PXA of FIG. 3 are illustrated as an example.

The light collection layer CLL may be disposed on the light emitting element layer DP-EDL. The plurality of prism patterns PP may be disposed to be spaced apart from each other in the first direction DR1. Each of the plurality of prism patterns PP may extend in the second direction DR2. Each of the plurality of prism patterns PP may have a stripe pattern (e.g., a stripe shape). Each of the plurality of prism patterns PP may have a triangular prism shape in cross-section when cut in the first direction DR1.

The light collection layer CLL may be directly disposed on the light emitting element layer DP-EDL. For example, an insulation base layer made of an acrylic resin is formed on the light emitting element layer DP-EDL, and then, a roller with the prism pattern formed on a surface thereof may move in the first direction DR1 to form the plurality of prism patterns PP, which are arranged in the first direction DR1, on one surface of the insulation base layer. Thus, the light collection layer CLL having the plurality of prism patterns PP may be disposed on the light emitting element layer DP-EDL.

In another example, the light collection layer CLL may be provided in the form of a film and/or a sheet. When the light collection layer CLL is provided in the form of a separate film and/or sheet, an adhesion layer may be disposed between the light collection layer CLL and the light emitting element layer DP-EDL. Thus, the light collection layer CLL may be fixed to a top surface of the light emitting element layer DP-EDL by the adhesion layer.

The display panel DP according to the present disclosure may include a protection layer PL, a color conversion layer CCL, and a second base layer BL2.

The protection layer PL may be disposed on the light collection layer CLL, and the color conversion layer CCL may be disposed on the protection layer PL. The protection layer PL may be disposed between the color conversion layer CCL and the light collection layer CLL. Although a structure in which the protection layer PL and the light collection layer CLL contact each other is illustrated in FIG. 4, the embodiment of the present disclosure is not limited thereto. For example, the protection layer PL and the light collection layer CLL may be spaced a predetermined (or set) distance from each other. Also, a sealing layer that seals a space between the protection layer PL and the light collection layer CLL may be further disposed between the protection layer PL and the light collection layer CLL to correspond to the peripheral area NAA (see FIG. 3).

The protection layer PL may prevent (or reduce) moisture and/or oxygen (hereinafter, referred to as "moisture/oxygen") from being permeated. The protection layer PL may prevent (or reduce) the color conversion layer CCL from being exposed to the moisture/oxygen.

The protection layer PL may include at least one inorganic layer. For example, the protection layer PL may include an inorganic material. For example, the protection layer PL may include at least one selected from silicon nitride, aluminum nitride, zirconium nitride, titanium nitride, hafnium nitride, silicon oxide, aluminum oxide, titanium oxide, tin oxide, cesium oxide, silicon oxynitride, and a metal thin film having secured light transmittance. The protection layer PL may further include an organic layer. The protection layer PL may be provided as a single layer or a plurality of layers.

The color conversion layer CCL may include a light conversion material. The light conversion material may be a quantum dot or a phosphor. The light conversion material may convert a wavelength of received light and may emit light having the converted wavelength. The color conversion layer CCL may be a layer including the quantum dot or a layer including the phosphor.

The color conversion layer CCL may include a plurality of color conversion layers CCL1, CCL2, and CCL3. The color conversion layers CCL1, CCL2, and CCL3 may be spaced apart from each other in the first and second directions.

A light blocking layer BML may be disposed between the color conversion layers CCL1, CCL2, and CCL3, which are spaced apart from each other, but the embodiment of the present disclosure is not limited thereto. The light blocking layer BML may overlap edges of the color conversion layers CCL1, CCL2, and CCL3. The light blocking layer BML may be a black matrix. The light blocking layer BML may contain an organic light blocking material or an inorganic light blocking material including a black pigment and/or dye. The light blocking layer BML may prevent (or reduce) a light leakage phenomenon from occurring and distinguish boundaries between the color conversion layers CCL1, CCL2, and CCL3 adjacent to each other.

The color conversion layers CCL1, CCL2, and CCL3 may include a first color conversion layer CCL1 converting (or configured to convert) the first color light provided from the light emitting element layer DP-EDL into a second color light, a second color conversion layer CCL2 converting the first color light into a third color light, and a third color conversion layer CCL3 transmitting the first color light therethrough. The first color conversion layer CCL1 may correspond to the first pixel area PXA1, the second color conversion layer CCL2 may correspond to the second pixel area PXA2, and the third color conversion layer CCL3 may correspond to the third pixel area PXA3.

In an embodiment, the first color conversion layer CCL1 may provide red light that is the second color light, and the second color conversion layer CCL2 may provide green light that is the third color light. The third color conversion layer CCL3 may transmit and provide blue light that is the first color light provided from the light emitting element layer DP-EDL.

The first color conversion layer CCL1 may include a matrix part MX and first quantum dots QD1 that are dispersed in the matrix part MX. The first color conversion layer CCL1 may further include a light scattering agent SP dispersed in the matrix part MX. The second color conversion layer CCL2 may include a matrix part MX and second quantum dots QD2 that are dispersed in the matrix part MX. For example, the first quantum dots QD1 may be red quantum dots, and the second quantum dots QD2 may be green quantum dots. The third color conversion layer CCL3 may further include a matrix part MX and a light scattering agent SP.

The matrix part MX may be a medium in which the quantum dots QD1 and QD2 and/or the light scattering agent SP are dispersed and may be made of one or more suitable resin compositions that are generally referred to as binders. The matrix part MX may include a polymer resin composition. For example, the polymer resin composition forming the matrix part MX may include an acrylic resin, a urethane resin, a silicone resin, an epoxy resin, and/or the like. The polymer resin composition may be transparent.

The quantum dots QD1 and QD2 may be particles that convert a wavelength of light provided from the display panel DP (e.g., into light having a different wavelength). Each of the quantum dots QD1 and QD2 may be a material having a crystal structure having a size of several nanometers. The quantum dot may be composed of hundreds to thousands of atoms to provide a quantum confinement effect, in which an energy band gap increases due to the small size. When light having a wavelength with energy greater than that of a band gap is incident onto the quantum dots QD1 and QD2, the quantum dots QD1 and QD2 may absorb the light and thus be in an excited state to emit light having a specific wavelength, thereby transitioning back to a ground state. The emitted light has a value corresponding to the band gap. When the quantum dots QD1 and QD2 are adjusted in size and composition, a light emitting characteristic due to a quantum confinement effect may be adjusted. The quantum dots QD1 and QD2 may change a color of emitted light according to a size of each of the particles of the quantum dots QD1 and QD2. As the particle size of each of the quantum dots decreases, light having a shorter wavelength region may be emitted. For example, the second quantum dot QD2 that emits the green light may have a particle size less than that of the first quantum dot QD1 that emits the red light.

Each of the quantum dots QD1 and QD2 may be selected from Group II-VI compounds, Group compounds, Group III-V compounds, Group IV-VI compounds, Group IV elements, Group IV compounds, and combinations thereof.

The Group II-VI compounds may be selected from binary element compounds selected from CdSe, CdTe, CdS, ZnS, ZnSe, ZnTe, ZnO, HgS, HgSe, HgTe, MgSe, MgS, and a combination thereof, ternary element compounds selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group compounds may be selected from ternary element compounds selected from $AgInS_2$, $CuInS_2$, $AgGaS_2$, $CuGaS_2$, and a combination thereof, and quaternary element compounds selected from $AgInGaS_2$ and $CuInGaS_2$.

The Group III-V compounds may be selected from binary element compounds selected from GaN, GaP, GaAs, GaSb, AlN, AlP, AlAs, AlSb, InN, InP, InAs, InSb, and a combination thereof, ternary element compounds selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and quaternary element compounds selected form GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further comprise the Group II elements. For example, the Group III-II-V compounds may be selected from InZnP.

The Group IV-VI compounds may be selected from binary element compounds selected from SnS, SnSe, SnTe, PbS, PbSe, PbTe, and a combination thereof, ternary element compounds selected from SnSeS, SnSeTe, SnSTe, PbSeS, PbSeTe, PbSTe, SnPbS, SnPbSe, SnPbTe, and a combination thereof, and quaternary element compounds selected form SnPbSSe, SnPbSeTe, SnPbSTe, and a combination thereof. The Group IV elements may be selected from Si, Ge, and a combination thereof. The Group IV compounds may be binary element compounds selected from SiC, SiGe, and a combination thereof.

Here, the binary element compounds, the ternary element compounds, and the quaternary element compounds may each independently exist in the particle at a uniform concentration or exist in the particle in a state in which concentration distribution is partitioned (separated) into partially different states.

Each of the first and second quantum dots QD1 and QD2 may have a core shell structure including a core and a shell surrounding the core. In one or more embodiments, the quantum dot may have a core/shell structure in which one quantum dot surrounds the other quantum dot. An interface between the core and the shell may have a concentration gradient in which an element existing in the shell has a concentration that gradually decreases toward a center.

Each of the first and second quantum dots QD1 and QD2 may have particles having a size on a nano scale. Each of the first and second quantum dots QD1 and QD2 may have a full width of half maximum (FWHM) of an emission wavelength spectrum of about 45 nm or less, for example, about 40 nm or less, or about 30 nm or less. In this range, color purity and color reproducibility may be improved. Also, light emitted through the first and second quantum dots QD1 and QD2 may be emitted in all directions to improve an optical viewing angle.

Each of the first and second quantum dots QD1 and QD2 may have any suitable shape and is not specifically limited in shape. For example, the quantum dot may have a spherical shape, a pyramidal shape, a multi-arm shape, a cubic nanoparticle shape, a nanotube shape, a nanowire shape, a nanofiber shape, a nanoplate particle shape, and/or the like.

The light scattering agent SP may be an inorganic particle. For example, the light scattering agent SP may include at least one of $TiO_2$, ZnO, $Al_2O_3$, $SiO_2$, or hollow silica. The light scattering agent SP may include one of $TiO_2$, ZnO, $Al_2O_3$, $SiO_2$ or hollow silica, or a mixture of two or more materials selected from $TiO_2$, ZnO, $Al_2O_3$, $SiO_2$, and hollow silica.

The second base layer BL2 may be disposed on the light blocking layer BML and the color conversion layer CCL. The second base layer BL2 may be a member that provides a base surface on which the light blocking layer BML, the color conversion layer CCL, and the protection layer PL are disposed. The second base substrate layer BL2 may be a glass substrate, a metal substrate, and/or a plastic substrate. However, the embodiment of the present disclosure is not limited thereto. For example, the second base substrate layer BL2 may be an inorganic layer, an organic layer, or a composite layer.

As illustrated in FIGS. 5 and 6, the plurality of pixel areas PXA1 to PXA3 of the display panel DP according to an embodiment may be disposed to be spaced apart from each other in the first direction DR1 and the second direction DR2. The plurality of pixel areas PXA may be arranged in the form of a matrix on a plane defined by the first direction DR1 and the second direction DR2. The pixel areas PXA1, PXA2, and PXA3, which output light having colors different from each other, may be disposed to be spaced apart from each other in the first direction DR1, and the pixel areas, which output light having the same color, may be disposed to be spaced apart from each other in the second direction DR2. When the first direction DR1 is defined as a row direction, and the second direction DR2 is defined as a column direction, the pixel areas disposed in the same column may output light having the same color. Hereinafter, for convenience of description, the pixel areas that are disposed in the same column may be defined as a pixel column.

At least one or more prism patterns of the plurality of prism patterns PP may be disposed to correspond to one pixel column. A width W1 of each of the plurality of prism patterns PP in the first direction DR1 may be less than that of each of the pixel areas PXA1 to PXA3. That is, one pixel column may correspond to the plurality of prism patterns PP.

For example, as illustrated in FIG. 6, the plurality of prism patterns PP disposed to correspond to the first pixel area PXA1 may collect the first color light CL1 outputted from the light emitting layer EDL of the light emitting element layer DP-EDL to provide the collected light to the corresponding first color conversion layer CCL1. As a result, although the first color light CL1 outputted from the light emitting layer EDL is radially outputted, the first color light CL1 may be collected by an inclined surface disposed on the prism pattern PP of the light collection layer CLL to be emitted in a front direction. Thus, the first color light CL1 may be collected and emitted in the front direction and then be provided to the corresponding first color conversion layer CCL1. The first color conversion layer CCL1 may convert the first color light CL1, which collected in the front direction so as to be provided (emitted), into the second color light CL2 to output the second color light CL2.

According to the present embodiments, the first color light CL1 outputted from the corresponding pixel area may be provided to the color conversion layer adjacent to the corresponding pixel area, and/or a loss of the first color light CL1 due to the light blocking layer BML may be reduced by the light collection layer CLL, thereby improving light conversion efficiency of the first color light CL1 outputted from the light emitting layer EDL.

Also, the phenomenon in which the first color light CL1 outputted from the corresponding pixel area or the second color light CL2 converted from the first color light CL1 is provided to the adjacent pixel area may be prevented or reduced to prevent (or reduce) the display quality from being deteriorated due to the mixing of the colors between the pixel areas PXA1 to PXA3.

According to another embodiment of the present disclosure, a brightness enhancement film may be further disposed between the light collection layer CLL and the protection layer PL or between the light collection layer CLL and the light emitting element layer DP-EDL. The brightness enhanced film may perform a function of compensating brightness of the first color light CL1 outputted from the light emitting element layer DP-EDL to further improve the light efficiency of the first color light CL1.

Figure 7A:
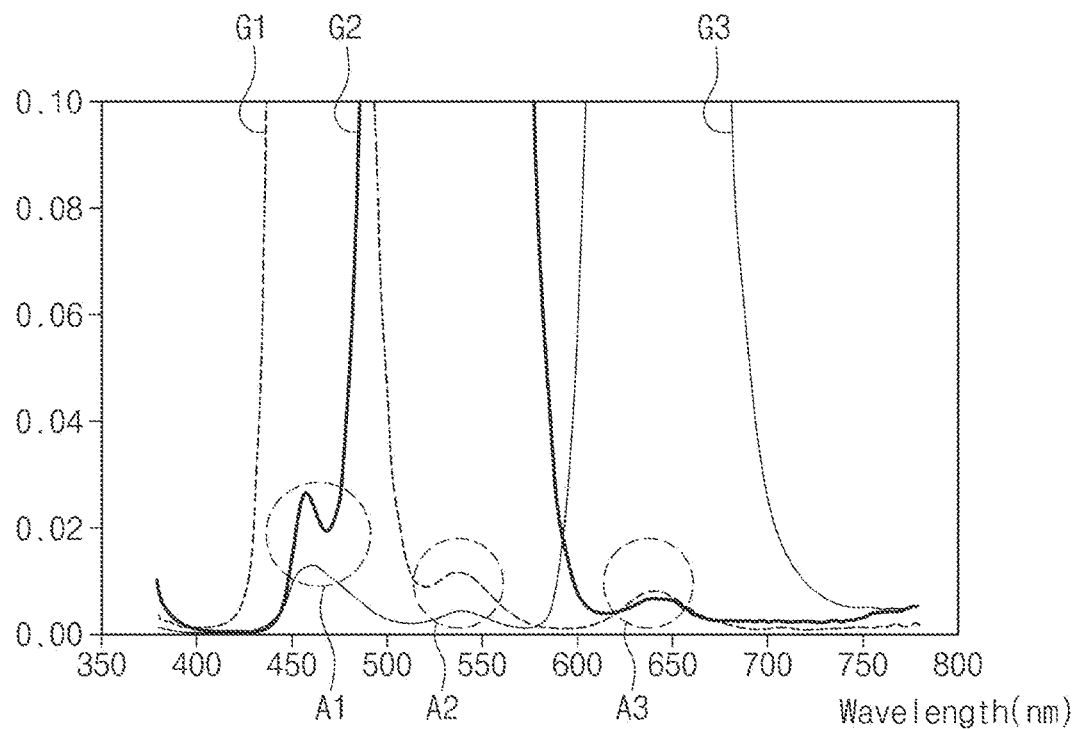
FIGS. 7A and 7B are graphs illustrating transmittance depending on a wavelength.
Figure 7B:
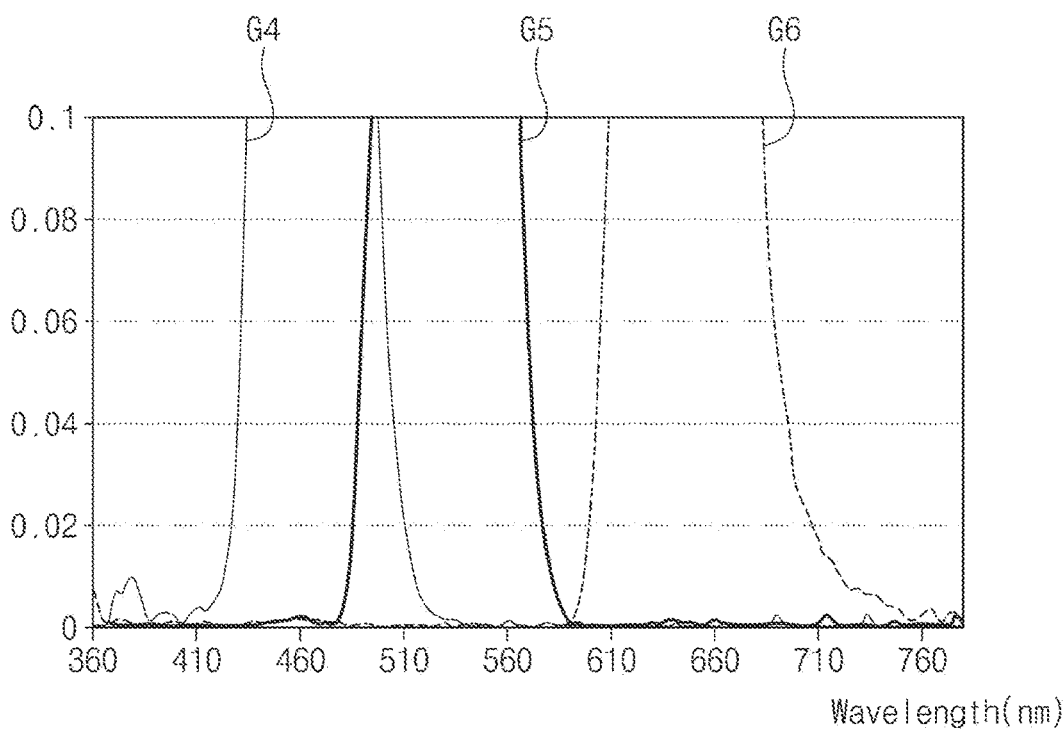

FIGS. 7A and 7B are graphs illustrating light transmittance depending on a wavelength. FIG. 7A illustrates transmittance for each wavelength of light outputted from the display panel when the light collection layer is not provided, and FIG. 7B illustrates transmittance for each wavelength of light outputted from the display panel when the light collection layer CLL is provided.

Referring to FIG. 7A, a first graph G1 shows transmittance of light outputted from the third pixel area PXA3, and a second graph G2 shows transmittance of light outputted from the second pixel area PXA2. The third graph G3 shows transmittance of light outputted from the first pixel area PXA1.

Here, the third pixel area PXA3 may be a pixel area that outputs the first color light (i.e., the blue light), the second pixel area PXA2 may be a pixel area that outputs the third color light (i.e., the green light), and the first pixel area PXA1 may be a pixel area that outputs the second color light (i.e., the red light).

As shown in the first graph G1, the light outputted from the third pixel area PXA3 may include some of light having green and/or red wavelength bands, like second and third portions A2 and A3, as well as light having a blue wavelength band. As shown in the second graph G2, the light outputted from the second pixel area PXA2 may include some of light having blue and/or red wavelength bands, like the first and third portions A1 and A3, as well as light having a green wavelength band. Similarly, referring to the third graph G3, the light outputted from the third pixel area PXA3 may include some of light having the blue and/or green wavelength bands, like the first and second portions A1 and A2, as well as light having the red wavelength band.

In the display panel in which the light collection layer CLL is not provided (e.g., in a related art display panel), the color mixing phenomenon in which the light outputted from each of the pixel areas PXA1 to PXA3 includes some of light having different wavelength bands, as well as the light having the corresponding wavelength band, may occur.

However, as illustrated in FIG. 7B, when the light collection layer CLL is provided in the display panel, the light emitted from each of the pixel areas PXA1 to PXA3 may be outputted as only (or substantially only) light having the corresponding wavelength band. Particularly, a fourth graph G4 shows transmittance of the light outputted from the third pixel area PXA3, and a fifth graph G5 shows transmittance of light outputted from the second pixel area PXA2. A sixth graph G6 shows transmittance of light outputted from the first pixel area PXA1.

As shown in the fourth graph G4, the light outputted from the third pixel area PXA3 may include the light having the blue wavelength band, while the light having the green and/or red wavelength bands may have transmittance that is close to almost zero. Similarly, referring to the fifth and sixth graphs G5 and G6, the light outputted from the second and first pixel areas PXA2 and PXA1, respectively, may include the light having the corresponding wavelength band, while the light having the different wavelength band may have transmittance that is close to almost zero.

As described above, in the display panel in which the light collection layer CLL is provided, the color mixing phenomenon in which the light outputted from each of the pixel areas PXA1 to PXA3 includes only (or substantially only) the light having the corresponding wavelength band may not occur.

Figure 8:
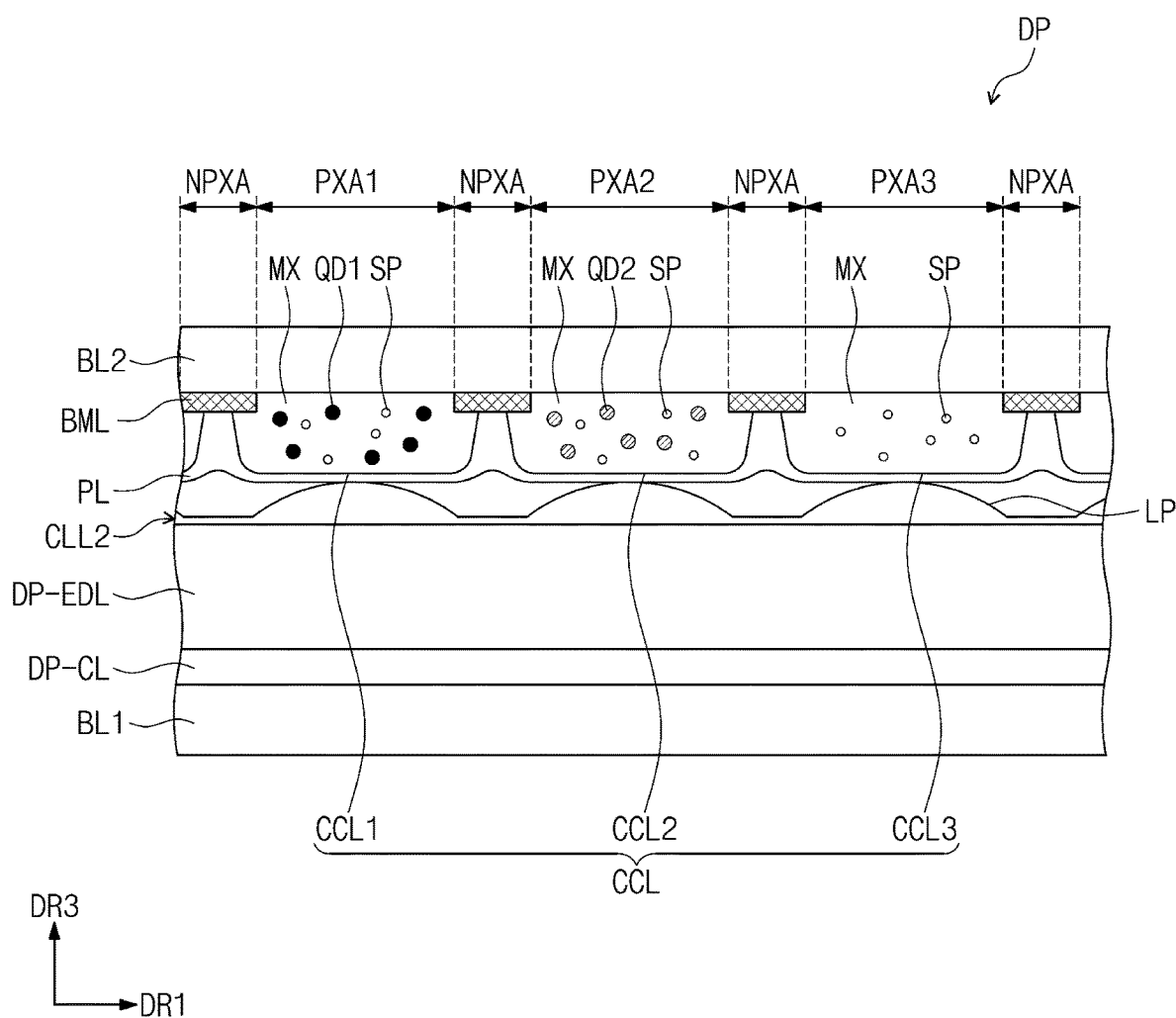
FIG. 8 is a cross-sectional view of a display panel according to an embodiment of the present disclosure.
Figure 9:
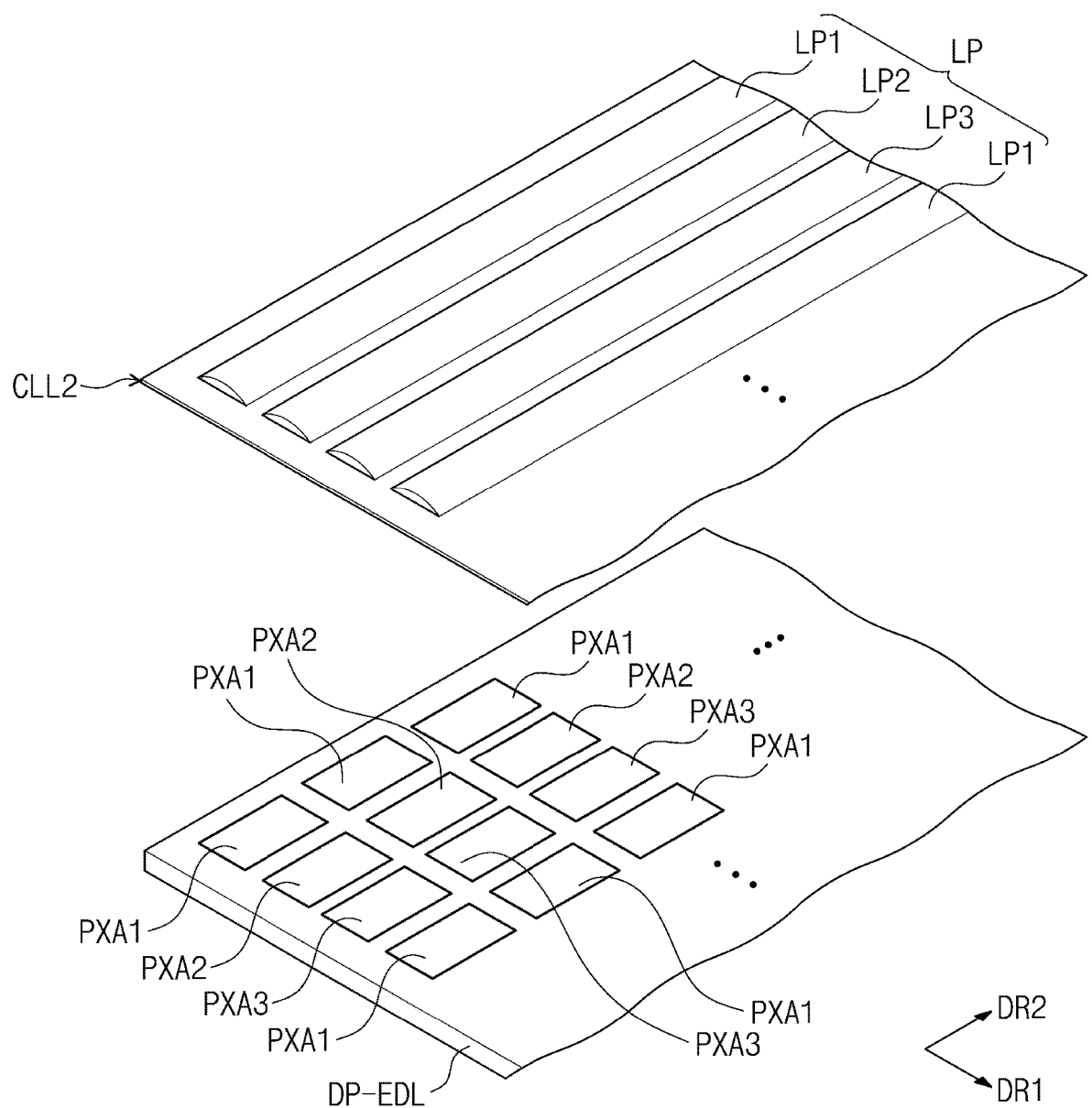
FIG. 9 is an exploded perspective view of a light emitting element layer and a light collection layer of FIG. 8.

FIG. 8 is a cross-sectional view of a display panel according to an embodiment of the present disclosure, and FIG. 9 is an exploded perspective view of a light emitting element layer and a light collection layer of FIG. 8.

Referring to FIGS. 8 and 9, the display panel DP according to an embodiment of the present disclosure includes a light collection layer CLL2 disposed on a light emitting element layer DP-EDL. The light collection layer CLL2 includes a plurality of lens patterns LP. In FIG. 9, for convenience of description, some pixel areas PXA1, PXA2, and PXA3 of the pixel areas PXA of FIG. 3 are illustrated as an example.

The light collection layer CLL2 may be disposed on the light emitting element layer DP-EDL. The plurality of lens patterns LP may be disposed to be spaced apart from each other in the first direction DR1. Each of the plurality of lens patterns LP may extend in the second direction DR2. Each of the plurality of lens patterns LP may have a stripe pattern (shape). Each of the plurality of lens patterns LP may have a semicircular shape in cross-section when cut in the first direction DR1.

The light collection layer CLL2 may be directly disposed on the light emitting element layer DP-EDL. Each of the plurality of lens patterns LP may be disposed to correspond to one pixel column. That is, a width of each of the plurality of lens patterns LP in the first direction DR1 may be less than or equal to that of each of the pixel areas. Although a structure in which each of the lens patterns LP has a width corresponding to each of the pixel areas is illustrated in FIG. 8, the embodiment of the present disclosure is not limited thereto. According to another embodiment of the present disclosure, each of the lens patterns LP may have a width that is less than that of each of the pixel areas. In this case, two or more lens patterns LP may be disposed in one pixel column.

Each of the plurality of lens patterns LP may be adjusted in curvature radius and height to control a traveling direction of the first color light outputted from the light emitting element layer DP-EDL.

The light collection layer CLL2 may be made of an acrylic resin and be provided on a top surface of the light emitting element layer DP-EDL through a photo process or an imprinting process.

In some embodiments, the light collection layer CLL2 may be provided on the light emitting element layer DP-EDL in the form of a film and/or a sheet. When the light collection layer CLL2 is provided in the form of a separate film and/or sheet, an adhesion layer may be disposed between the light collection layer CLL2 and the light emitting element layer DP-EDL. Thus, the light collection layer CLL2 may be fixed to a top surface of the light emitting element layer DP-EDL by the adhesion layer.

As illustrated in FIGS. 8 and 9, the plurality of lens patterns LP disposed to correspond to each of the pixel areas may collect the first color light CL1 outputted from the light emitting layer of the light emitting element layer DP-EDL to provide the collected light to the corresponding first color conversion layer CCL1.

As described above, the light efficiency of the first color light provided from each of the pixel areas PXA1 to PXA3 may be improved to prevent (or reduce) the display quality from being deteriorated due to the mixing of the colors between the adjacent pixel areas.

Figure 10:
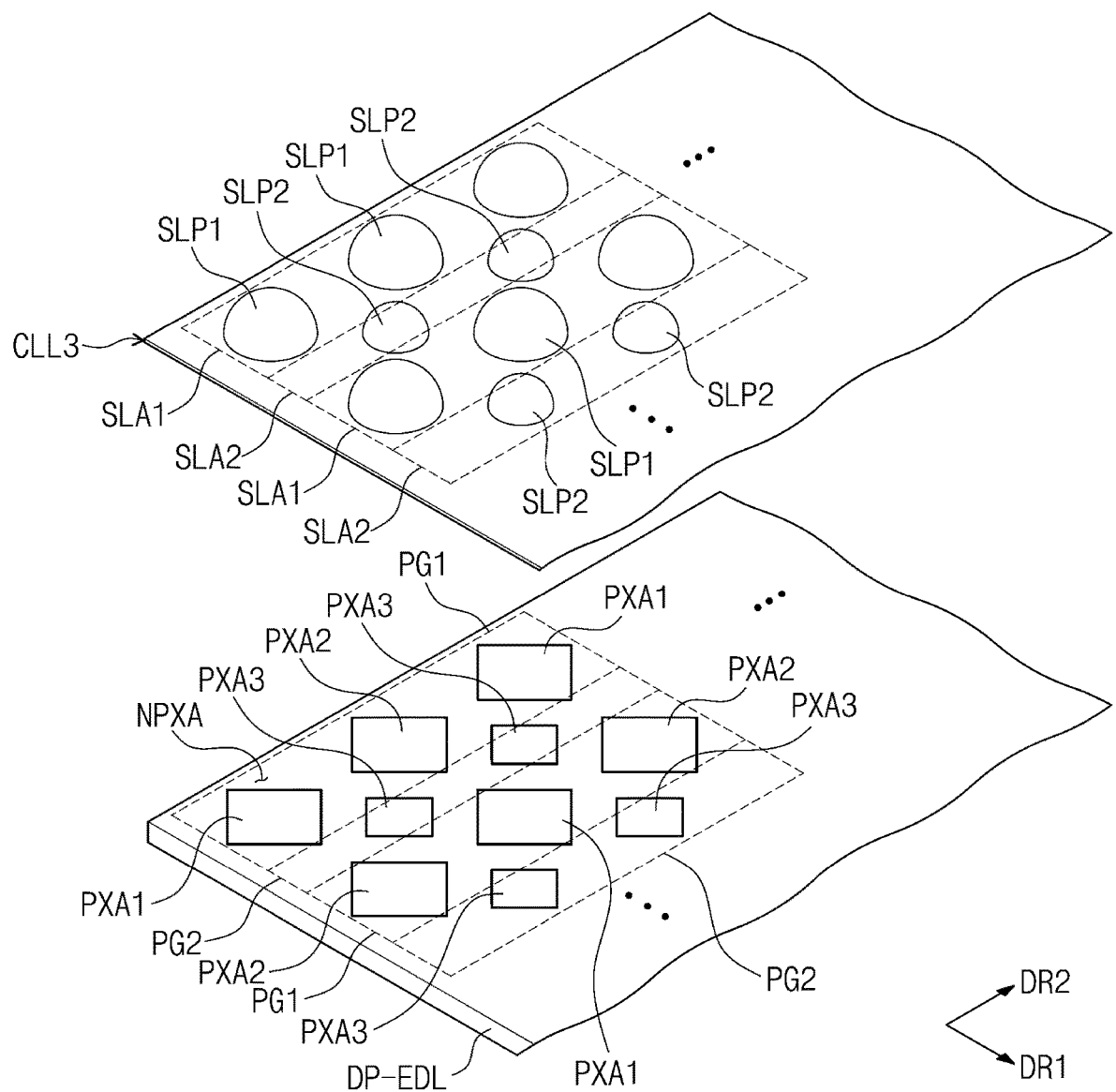
FIG. 10 is an exploded perspective view of a light emitting element layer and a light collection layer according to an embodiment of the present disclosure.

FIG. 10 is an exploded perspective view of the light emitting element layer and the light collection layer according to an embodiment of the present disclosure.

Referring to FIG. 10, the light emitting element layer DP-EDL according to an embodiment of the present disclosure may include first pixel groups PG1 and second pixel groups PG2. The first pixel groups PG1 and the second pixel groups PG2 may be alternately repeatedly arranged in the first direction DR1.

The first pixel groups PG1 may include a plurality of first pixel areas PXA1 and a plurality of second pixel areas PXA2. The plurality of first pixel areas PXA1 and the plurality of second pixel areas PXA2 may be alternately arranged in the second direction. The second pixel groups PG2 may include a plurality of third pixel areas PXA3. A non-pixel area NPXA may be defined between the first to third pixel areas PXA1, PXA2, and PXA3.

The arranged structure of the first to third pixel areas PXA1, PXA2, and PXA3, which is illustrated in FIG. 10, is merely an example, and thus, the embodiment of the present disclosure is not limited thereto. Also, although each of the first to third pixel areas PXA1, PXA2, and PXA3 are illustrated to have a rectangular shape, the embodiment of the present disclosure is not limited thereto. For example, each of the first to third pixel areas PXA1, PXA2, and PXA3 may have any suitable shape, such as a polygonal shape, a circular shape, an oval shape, and/or the like. In some embodiments, the first to third pixel areas PXA1, PXA2, and PXA3 may have shapes different from each other. For example, the first pixel area PXA1 may have a circular shape, and each of the second and third pixel areas PXA2 and PXA3 may have a rectangular shape.

Also, although each of the third pixel areas PXA3 are illustrated to have a size less than that of each of the first pixel areas PXA1 and the second pixel areas PXA2 in FIG. 10, the embodiment of the present disclosure is not limited thereto. For example, according to another embodiment of the present disclosure, the first to third pixel areas PXA1, PXA2, and PXA3 may have the same size.

The display panel according to an embodiment of the present disclosure includes a light collection layer CLL3 disposed on a light emitting element layer DP-EDL. The light collection layer CLL3 includes a first lens group SLA1 corresponding to a first pixel group PG1 and a second lens group SLA2 corresponding to a second pixel group PG2. The first lens group SLA1 and the second lens groups SLA2 are alternately arranged in the first direction DR1.

The first lens group SLA1 includes first lens patterns SLP1. The first lens patterns SLP1 is disposed to correspond to the first and second pixel areas PXA1 and PXA2, respectively. The second lens group SLA2 includes second lens patterns SLP2. The second lens patterns SLP2 are disposed to correspond to the third pixel areas PXA3, respectively. The first lens patterns SLP1 are arranged to be spaced apart from each other in the second direction DR2, and the second lens patterns SLP2 are arranged to be spaced apart from each other in the second direction DR2.

Each of the first and second lens patterns SLP1 and SLP2 may have a solid hemispherical shape. When viewed in the plane (e.g., when viewed in a plan view), each of the first and second lens patterns SLP1 and SLP2 may have a circular shape. However, the shape of each of the first and second lens patterns SLP1 and SLP2 is not limited thereto. For example, each of the first and second lens patterns SLP1 and SLP2 may have a three-dimensional shape such as a triangular pyramid shape, a quadrangular pyramid shape, a cone shape, and/or the like.

In FIG. 10, each of the first lens patterns SLP1 and each of the second lens patterns SLP2 have sizes different from each other. That is, each of the lens patterns SLP1 and SLP2 may vary in size according to the corresponding pixel. However, the configuration according to the embodiment of the present disclosure is not limited thereto. For example, the first lens patterns SLP1 and the second lens patterns SLP2 may have the same size.

Each of the first and second lens patterns SLP1 and SLP2 may be adjusted in curvature radius and height to control a traveling direction of the first color light outputted from the light emitting element layer DP-EDL.

The light collection layer CLL3 may be made of an acrylic resin and be directly provided on a top surface of the light emitting element layer DP-EDL through a photo process or an imprinting process.

In some embodiments, the light collection layer CLL3 may be provided in the form of a film and/or a sheet. When the light collection layer CLL3 is provided in the form of a separate film and/or sheet, an adhesion layer may be disposed between the light collection layer CLL3 and the light emitting element layer DP-EDL. Thus, the light collection layer CLL3 may be fixed to a top surface of the light emitting element layer DP-EDL by the adhesion layer.

Figure 11:
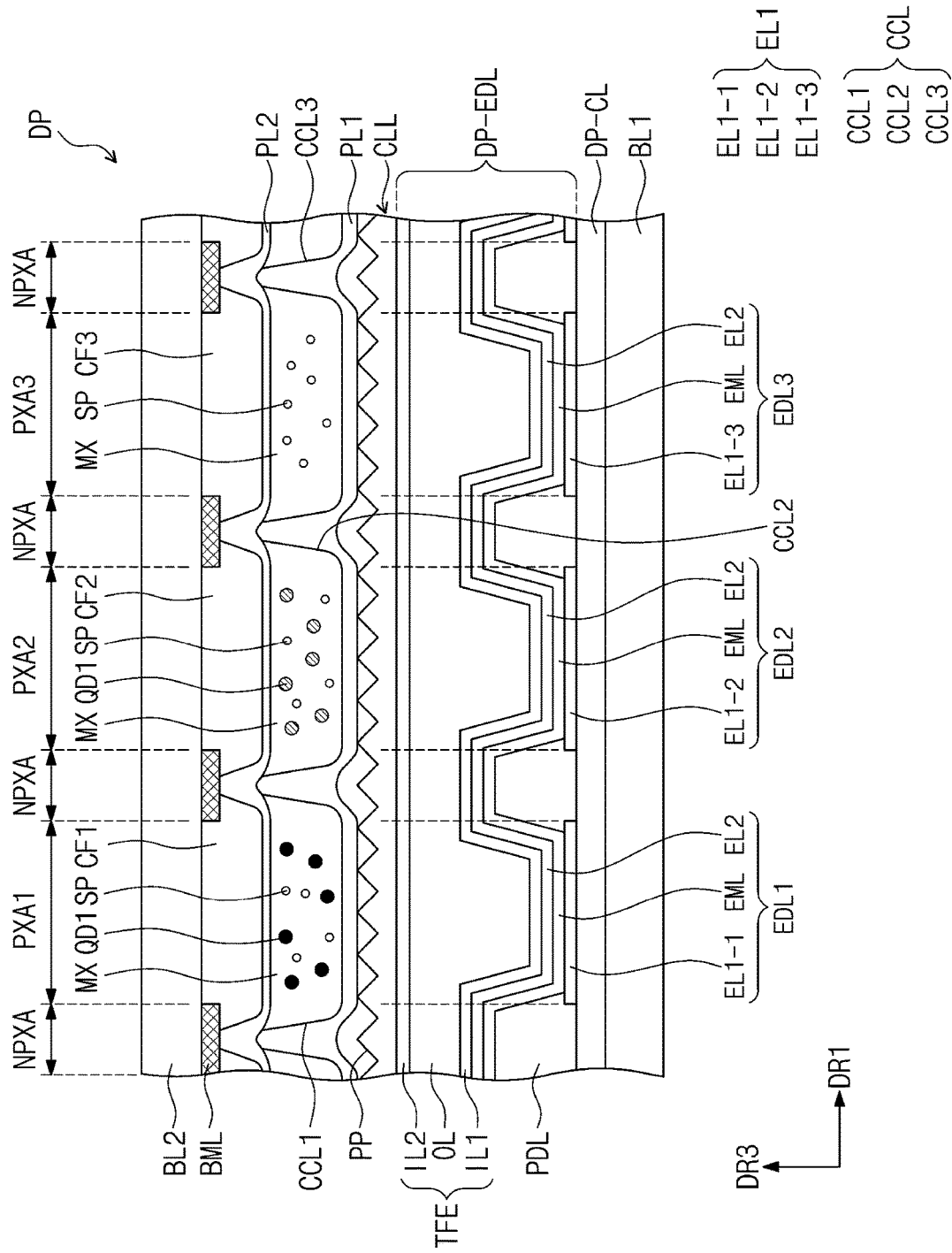
FIG. 11 is a cross-sectional view of a display panel according to an embodiment of the present disclosure.

FIG. 11 is a cross-sectional view of a display panel according to an embodiment of the present disclosure. In description of FIG. 11, the same reference numerals may be given to components that are the same as the components of FIG. 4, and their detailed descriptions will not be provided here.

Referring to FIG. 11, in the display panel according to an embodiment of the present disclosure, the light emitting element layer DP-EDL may include a pixel defining layer PDL, a plurality of organic electroluminescent elements EDL1, EDL2, and EDL3, and an encapsulation layer TFE.

The pixel defining layer PDL may be a layer that partitions the light emitting element layer DP-EDL into the plurality of pixel areas PXA1 to PXA3. For example, an opening that corresponds to each of the plurality of pixel areas PXA1 to PXA3 may be defined in the pixel defining layer PDL, and an area on which the pixel defining layer PDL is provided, may be defined as a non-pixel area NPXA.

The pixel defining layer PDL may be made of a polymer resin. For example, the pixel defining layer PDL may include a polyacrylate-based resin and/or a polyimide-based resin. Also, the pixel defining layer PDL may further include an inorganic material, in addition to the polymer resin. The pixel defining layer PDL may include a light absorbing material or may include a black pigment and/or a black dye. The pixel defining layer PDL including the black pigment and/or the black dye may realize a black pixel defining layer. When the pixel defining layer PDL is formed, the black pigment and/or the black dye may be a carbon black, but the embodiment of the present disclosure is not limited thereto.

The plurality of organic electroluminescent elements EDL1, EDL2, and EDL3 may be provided to correspond to the corresponding pixel areas (e.g., first to third pixel areas PXA1 to PXA3), respectively. Each of the organic electroluminescent elements EDL1, EDL2, and EDL3 may include first electrodes EL1-1, EL1-2, and EL1-3, respectively. Each of the first electrodes EL1-1, EL1-2, and EL1-3 may be provided to correspond to the corresponding pixel area and may be disposed to be spaced apart from the first electrode of the adjacent pixel area. The first electrodes EL1-1, EL1-2, and EL1-3 provided on the plurality of pixel areas PXA1 to PXA3 may constitute the first electrode layer EU of the display circuit layer DP-CL. Each of the first electrodes EL1-1, EL1-2, and EL1-3 may be exposed by the corresponding opening of the pixel defining layer PDL.

Each of the first electrodes EL1-1, EL1-2, and EL1-3 may be made of a metal alloy and/or a conductive compound. Each of the first electrodes EL1-1, EL1-2, and EL1-3 may be an anode. Each of the first electrodes EL1-1, EL1-2, and EL1-3 may be a pixel electrode.

In each of the organic electroluminescent elements according to an embodiment, each of the first electrodes EL1-1, EL1-2, and EL1-3 may be a reflective electrode. However, the embodiment of the present disclosure is not limited thereto. For example, the first electrodes EL1-1, EL1-2, and EL1-3 may each independently be a transmissive electrode or a transflective electrode. When the first electrodes are each independently the transflective electrode or the reflective electrode, the first electrodes EL1-1, EL1-2, and EL1-3 may each independently include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some embodiments, the first electrode may have a multi-layered structure including a reflective layer or a transflective layer, and a transparent conductive layer made of indium tin oxide (ITO), indium zinc oxide (IZO), zinc oxide (ZnO), and/or indium tin zinc oxide (ITZO). For example, the first electrodes EL1-1, EL1-2, and EL1-3 may each independently be a multilayered metal layer, for example, may have a structure in which metal layers of ITO/Ag/ITO are laminated.

Each of the organic electroluminescent elements EDL1, EDL2, and EDL3 may further include a light emitting layer EML and a second electrode EL2.

The light emitting layer EML may have a single layer structure formed of a single material, a single layer structure formed of materials different from each other, or a multi-layered structure including a plurality of layers formed of materials different from each other.

The light emitting layer EML may emit first color light. The light emitting layer EML is not particularly limited and may be any suitable material, including a fluorescent material and/or a phosphorescent material. In some embodiments, the light emitting layer EML may include a host and/or a dopant. In FIG. 11, the light emitting layer EML may be provided as a common layer throughout the first to third pixel regions PXA1 to PXA3.

A hole transport region may be provided between the light emitting layer EML and the first electrode layer EL1. The hole transport region may include a hole transport layer and a hole injection layer.

The second electrode EL2 may be disposed on the light emitting layer EML. The second electrode EL2 may be a common electrode and/or a cathode. The second electrode EL2 may be made of a metal alloy and/or a conductive compound. The second electrode EL2 may be a transmissive electrode, a transflective electrode, or a reflective electrode.

When the second electrode EL2 is the transmissive electrode, the second electrode EL2 may be made of metal oxide, for example, indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some embodiments, the second electrode EL2 may have a multi-layered structure including a reflective layer or a transflective layer, and a transparent conductive layer made of indium tin oxide (ITO), indium zinc oxide (IZO), zinc oxide (ZnO), and/or indium tin zinc oxide (ITZO).

In FIG. 11, the second electrode EL2 may be provided as a common layer throughout the first to third pixel regions PXA1 to PXA3.

An electron transport region may be provided between the second electrode EL2 and the light emitting layer EML. The electron transport region may include at least one selected from a hole blocking layer, an electron transport layer, and an electron injection layer, but the embodiment of the present disclosure is not limited thereto. When the electron transport region includes the electron injection layer and the electron transport layer, any suitable electron injection material and any suitable electron transport material may be used for the electron injection layer and the electron transport layer, respectively.

The encapsulation layer TFE may be disposed on the plurality of organic electroluminescent elements EDL1, EDL2, and EDL3. The encapsulation layer TFE covers the plurality of organic electroluminescent elements EDL1, EDL2, and EDL3. That is, each of the plurality of organic electroluminescent elements EDL1, EDL2, and EDL3 may be sealed by the encapsulation layer TFE.

According to an embodiment of the present disclosure, the encapsulation layer TFE may include a first inorganic layer IL1, an organic layer OL, and a second inorganic layer IL2. The organic layer OL may be disposed between the first inorganic layer IL1 and the second inorganic layer IL2. The first inorganic layer IL1 and the second inorganic layer IL2 may be formed by depositing an inorganic material, and the organic layer OL may be formed by depositing, printing, and/or applying an organic material.

The first inorganic layer IL1 and the second inorganic layer IL2 may protect the plurality of organic electroluminescent elements EDL1, EDL2, and EDL3 against moisture and/or oxygen, and the organic layer OL may protect the plurality of organic electroluminescent elements EDL1, EDL2, and EDL3 against foreign substances such as dust particles. The first inorganic layer IL1 and the second inorganic layer IL2 may each independently include at least one of silicon nitride, silicon oxide nitride, silicon oxide, titanium oxide, or aluminum oxide. For example, the organic layer OL may include an acrylic-based organic layer. However, the embodiment of the present disclosure is not limited thereto.

Although the encapsulation layer TFE includes two inorganic layers and one organic layer in FIG. 11, the embodiment of the present disclosure is not limited thereto. For example, the encapsulation layer TFE may include three inorganic layers and two organic layers. In this case, the inorganic layers and the organic layers may be alternately laminated.

In the display panel according to an embodiment of the present disclosure, the light collection layer CLL may be disposed on the encapsulation layer TFE. According to an embodiment of the present disclosure, the light collection layer CLL may be disposed on the second inorganic layer IL2.

The display panel DP according to an embodiment of the present disclosure may include a first protection layer PL1, a color conversion layer CCL, a second protection layer PL2, color filter layers CF1 to CF3, a light blocking layer BML, and a second base layer BL2.

The second protection layer PL2 may be disposed on the first protection layer PL1, and the color conversion layer CCL may be disposed on the first protection layer PL1. The first protection layer PL1 may be disposed between the color conversion layer CCL and the light collection layer CLL. Although a structure in which the first protection layer PL1 and the light collection layer CLL contact each other is illustrated in FIG. 11, the embodiment of the present disclosure is not limited thereto. For example, the first protection layer PL1 and the light collection layer CLL may be spaced a predetermined (or set) distance from each other. Also, a sealing layer that seals a space between the first protection layer PL1 and the light collection layer CLL may be further disposed between the first protection layer PL1 and the light collection layer CLL to correspond to the peripheral area NAA (see FIG. 2).

The first protection layer PL1 may prevent (or reduce) moisture and/or oxygen (hereinafter, referred to as "moisture/oxygen") from being permeated. The first protection layer PL1 may prevent (or reduce) the color conversion layer CCL from being exposed to the moisture/oxygen.

The second protection layer PL2 may be disposed on the color conversion layer CCL, and the color filter layer CF1 to CF3 may be disposed on the second protection layer PL2.

The first and second protection layers PL1 and PL2 may include at least an inorganic layer. For example, each of the first and second protection layers PL1 and PL2 may include an inorganic material. For example, each of the first and second protection layers PL1 and PL2 may include at least one of silicon nitride, aluminum nitride, zirconium nitride, titanium nitride, hafnium nitride, titanium nitride, silicon oxide, aluminum oxide, titanium oxide, tin oxide, cesium oxide, silicon oxynitride, or a metal thin film having secured light transmittance. At least one of the first and second protection layers PL1 and PL2 may further include an organic layer. The first and second protection layers PL1 and PL2 may each independently be provided as a single layer or a plurality of layers. In some embodiments, at least one of the first and second protection layers PL1 and PL2 may be omitted.

The color filter layers CF1 to CF3 include a first color filter layer CF1 provided to correspond to the first color conversion layer CCL1, a second color filter layer CF2 provided to correspond to the second color conversion layer CCL2, and a third color filter layer CF3 provided to correspond to the third color conversion layer CCL3, respectively. The first color filter layer CF1 may be a red color filter layer, the second color filter layer CF2 may be a green color filter layer, and the third color filter layer CF3 may be a blue color filter layer.

Each of the first to third color filter layers CF1, CF2, and CF3 may be a polymeric photosensitive resin, a pigment, and/or dye. The first color filter layer CF1 may include a red pigment and/or dye, the second color filter layer CF2 may include a green pigment and/or dye, and the third color filter layer CF3 may include a blue pigment and/or dye.

However, the embodiment of the present disclosure is not limited thereto. For example, the third color filter layer CF3 may not include the pigment or dye. The third color filter layer CF3 may include the polymeric photosensitive resin and may not include the pigment or dye. The third color filter layer CF3 may be transparent. The third color filter layer CF3 may be made of a transparent photosensitive resin.

The first to third color filter layers CF1 and CF3 may be spaced apart from each other in the first direction DR1 and the second direction DR2 (see FIG. 3).

A light blocking layer BML may be disposed between the first to third color filter layers CF1 to CF3, which are spaced apart from each other, but the embodiment of the present disclosure is not limited thereto. The light blocking layer BML may overlap edges of the first to third color filter layers CF1 to CF3. The light blocking layer BML may be a black matrix. The light blocking layer BML may contain (include) an organic light blocking material and/or an inorganic light blocking material including a black pigment and/or a dye. The light blocking layer BML may prevent (or reduce) a light leakage phenomenon from occurring, and may distinguish (define) boundaries between the first to third color filter layers CF1 to CF3 that are adjacent to each other.

The second base layer BL2 may be disposed on the light blocking layer BML and the first to third color filter layers CF1 to CF3. The second base layer BL2 may be a member that provides a base surface on which the first to third color filter layers CF1 to CF3, the first to third color conversion layers CCL1 to CCL3, and the first and second protection layers PL1 and PL2 are disposed. The second base substrate layer BL2 may be a glass substrate, a metal substrate, and/or a plastic substrate. However, the embodiment of the present disclosure is not limited thereto. For example, the second base substrate BL2 may be an inorganic layer, an organic layer, or a composite layer.

Figure 12:
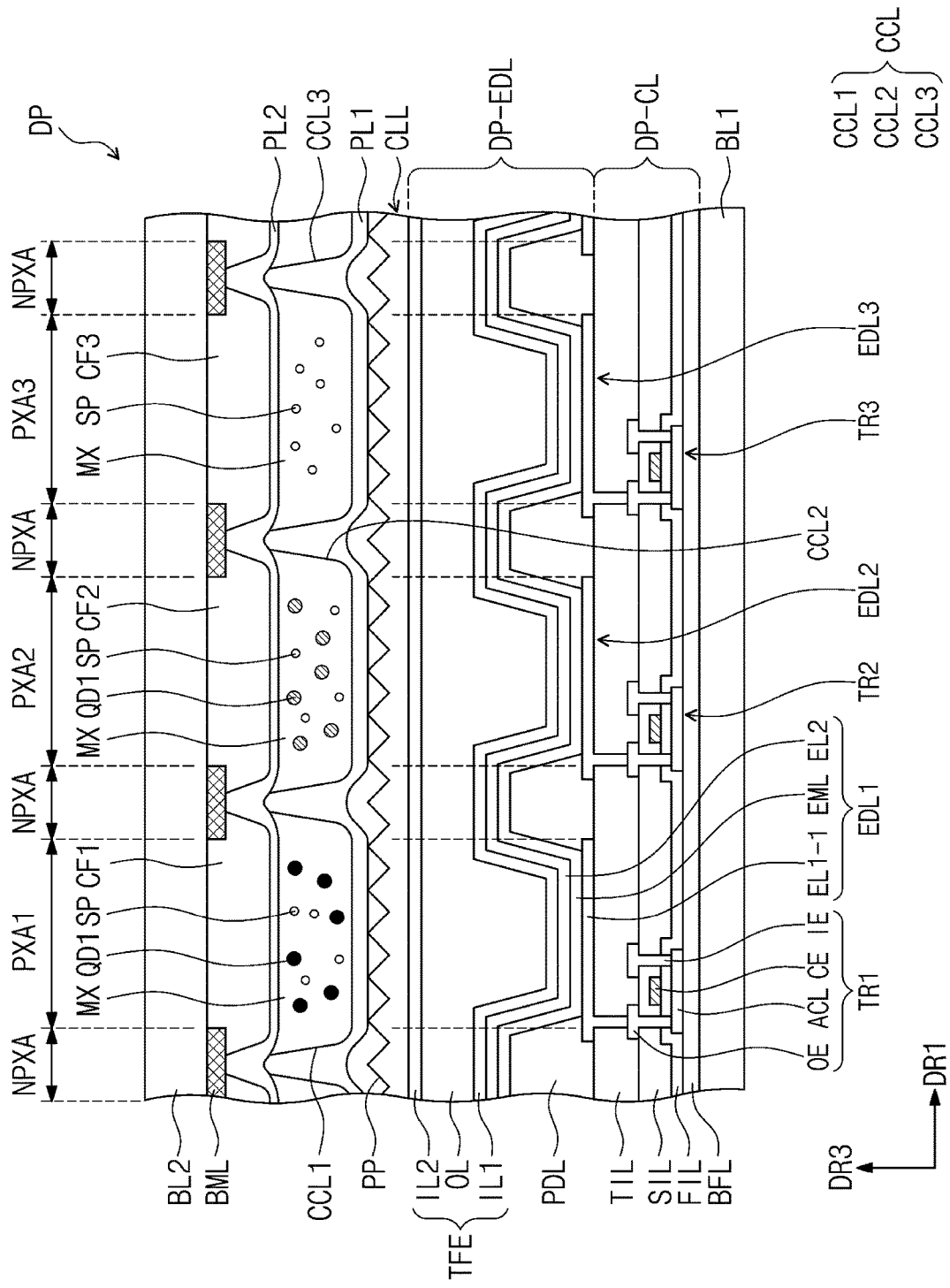
FIG. 12 is a cross-sectional view of a display panel according to an embodiment of the present disclosure.

FIG. 12 is a cross-sectional view of a display panel according to an embodiment of the present disclosure. In description of FIG. 12, the same reference numerals may be given to components that are the same as the components of FIG. 11, and their detailed descriptions will therefore not be provided.

Referring to FIG. 12, in the display panel according to an embodiment of the present disclosure, a display circuit layer DP-CL may include a buffer layer BFL, first to third transistors TR1, TR2, and TR3, and a plurality of insulation layers FIL, SIL, and TIL. The plurality of insulation layer FIL, SIL, and TIL may include a first insulation layer FIL, a second insulation layer SIL, and a third insulation layer TIL.

The buffer layer BFL may be disposed on the first base layer BL1, and the first to third transistors TR1, TR2, and TR3 may be disposed on the buffer layer BFL. The buffer layer BFL may include an inorganic material. The buffer layer BFL may prevent (or reduce) oxygen and/or moisture, which may be introduced through the first base layer BL1, from being permeated into the first to third transistors TR1, TR2, and TR3 and the light emitting element layer DP-EDL.

The first to third transistors TR1, TR2, and TR3 may have substantially the same structure. Thus, the first transistor TR1 will be described as a representative example. The first transistor TR1 may include a control electrode CE, an input electrode IE, an output electrode OE, and a semiconductor layer ACL.

The semiconductor layer ACL may be disposed on the buffer layer BFL. The buffer layer BFL may further include a light blocking material that blocks (or reduces) external light incident through (coming through) the first base layer BL1 from being incident onto the semiconductor layer ACL.

The semiconductor layer ACL may include polysilicon and/or amorphous silicon. In some embodiments, the semiconductor layer ACL may a metal oxide semiconductor. The semiconductor layer ACL may include a channel region, serving as a passage through which electrons or holes move, and first and second ion-doped regions disposed with the channel region therebetween.

The first insulation layer FIL may be disposed on the buffer layer BFL to cover the semiconductor layer ACL. The first insulation layer FIL may include an inorganic material. The inorganic layer may include at least one of silicon nitride, silicon oxynitride, silicon oxide, titanium oxide, and aluminum oxide.

The control electrode CE may be disposed on the first insulation layer FIL. The second insulation layer SIL may be disposed on the first insulation layer FIL to cover the control electrode CE. The second insulation layer SIL may be provided as a single layer or a plurality of layers. For example, the single layer may include an inorganic layer. The plurality of layers may include an organic layer and an inorganic layer.

The input electrode IE and the output electrode OE may be disposed on the second insulation layer SIL. The input electrode IE and the output electrode OE may be connected to the semiconductor layer ACL through through-holes passing through the first insulation layer FIL and the second insulation layer SIL.

The third insulation layer TIL may be disposed on the second insulation layer SIL to cover the input electrode IE and the output electrode OE. The third insulation layer TIL may be provided as a single layer or a plurality of layers. For example, the single layer may include an organic layer. The plurality of layers may include an organic layer and an inorganic layer. The third insulation layer TIL may be a planarization layer providing a flat (or substantially flat) surface on a top surface thereof. The light emitting element layer DP-EDL may be disposed on the third insulation layer TIL.

Figure 13:
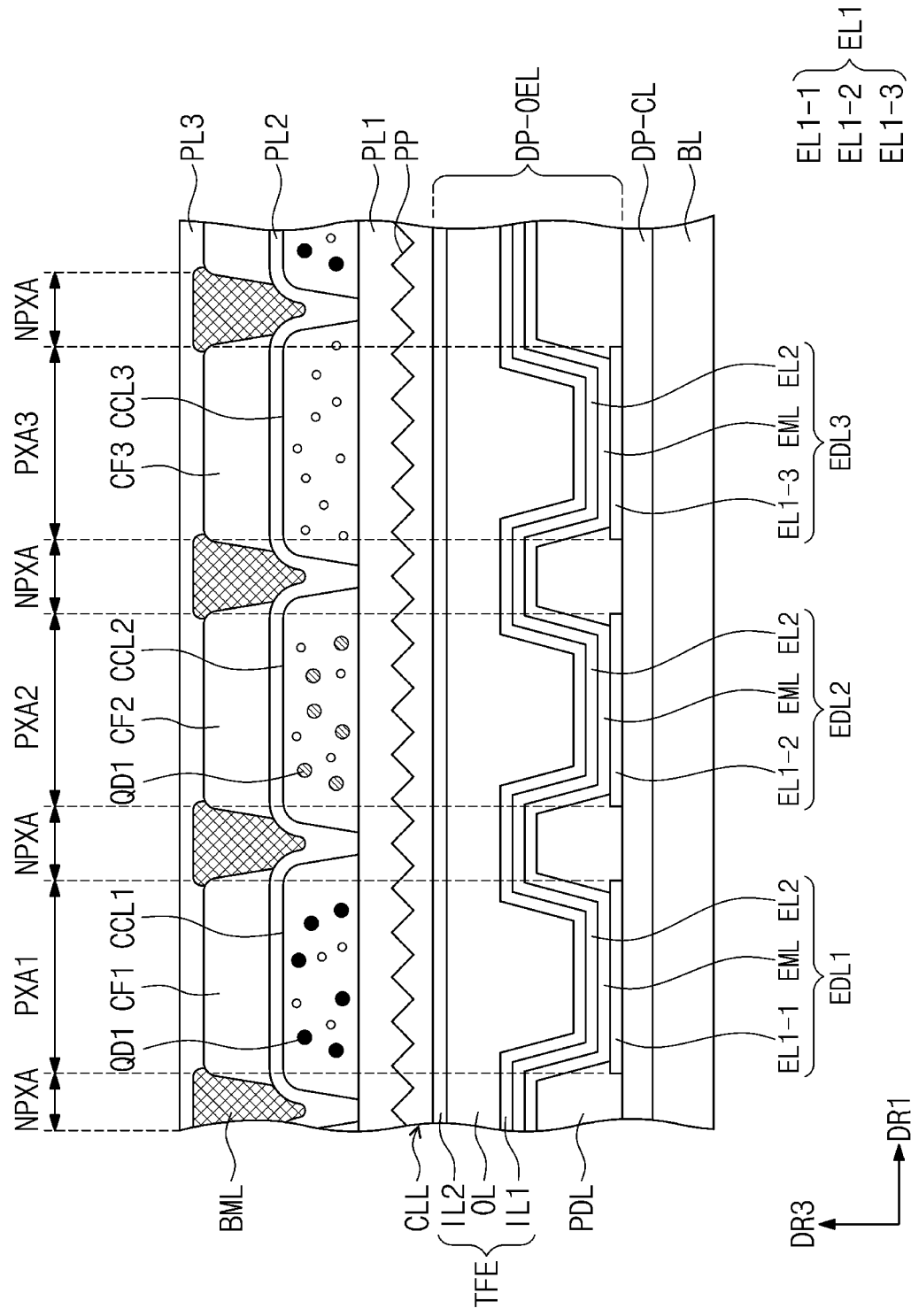
FIG. 13 is a cross-sectional view of a display panel according to an embodiment of the present disclosure.

FIG. 13 is a cross-sectional view of a display panel according to an embodiment of the present disclosure. In description of FIG. 13, the same reference numerals may be given to components that are the same as the components of FIG. 11, and their detailed descriptions will therefore not be provided.

Referring to FIG. 13, the display panel according to an embodiment of the present disclosure may include a first protection layer PL1, color conversion layers CCL1, CCL2, and CCL3, a second protection layer PL2, color filter layers CF1 to CF3, a light blocking layer BML, and a third protection layer PL3.

The first protection layer PL1 may be disposed on a light collection layer CLL. The first protection layer PL1 may be directly disposed on the light collection layer CLL through a continuous process. That is, a space may not be provided between the first protection layer PL1 and the light collection layer CLL. The color conversion layers CCL1 to CCL3 may be disposed on the first protection layer PL1, and the second protection layer PL2 may be disposed on the color conversion layers CCL1 to CCL3. The first and second protection layers PL1 and PL2 may have at least one inorganic layer and/or at least one organic layer.

The color filter layers CF1 to CF3 may include a first color filter layer CF1 provided to correspond to the first color conversion layer CCL1, a second color filter layer CF2 provided to correspond to the second color conversion layer CCL2, and a third color filter layer CF3 provided to correspond to the third color conversion layer CCL3. The first color filter layer CF1 may be a red color filter layer, the second color filter layer CF2 may be a green color filter layer, and the third color filter layer CF3 may be a blue color filter layer.

A light blocking layer BML may be disposed in a space between the first to third color filter layers CF1 to CF3, which are spaced apart from each other in the first direction DR1. The light blocking layer BML may overlap edges of the first to third color filter layers CF1 to CF3. The light blocking layer BML may be a black matrix. The light blocking layer BML may contain an organic light blocking material or an inorganic light blocking material including a black pigment and/or a dye. The light blocking layer BML may prevent (or reduce) a light leakage phenomenon from occurring, and may distinguish (define) boundaries between the first to third color filter layers CF1 to CF3 that are adjacent to each other.

The third protection layer PL3 may cover the light blocking layer BML and the first to third color filter layers CF1 to CF3. The third protection layer PL3 may prevent (or reduce) moisture/oxygen from being permeated. The third protection layer PL3 may prevent (or reduce) the light blocking layer BML and the first to third color filter layers CF1 to CF3 from being exposed to the moisture/oxygen. The third protection layer PL3 may have a single layer structure made of an inorganic material or an organic material or a structure in which a plurality of layers, each of which is made of an inorganic material or an organic material, are sequentially laminated. The third protection layer PL3 may include an inorganic layer made of at least one of silicon nitride, silicon oxynitride, silicon oxide, titanium oxide, and aluminum oxide, or may be an acrylic-based organic layer.

Figure 14:
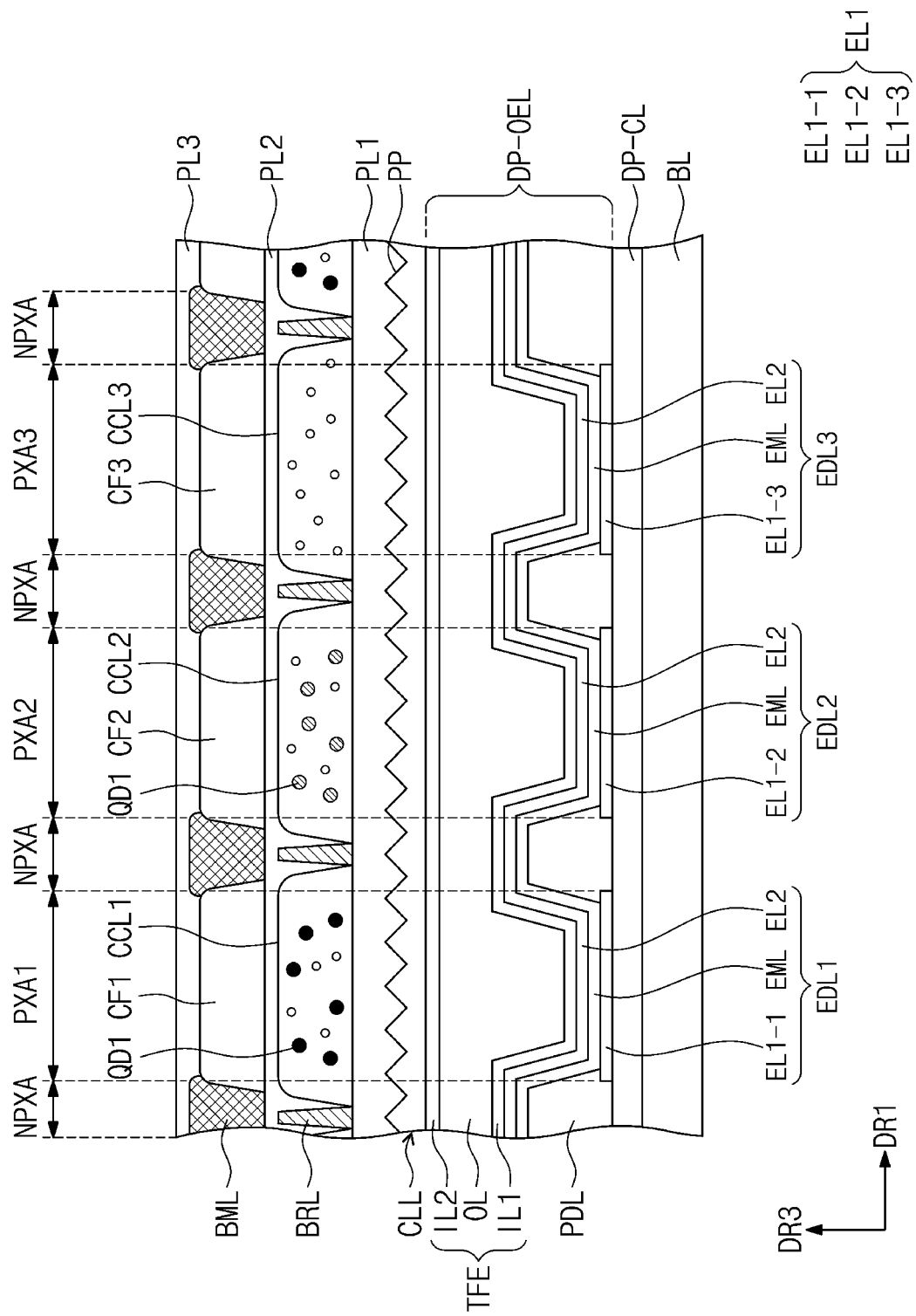
FIG. 14 is a cross-sectional view of a display panel according to an embodiment of the present disclosure.

FIG. 14 is a cross-sectional view of a display panel according to an embodiment of the present disclosure. In description of FIG. 14, the same reference numerals may be given to components that are the same as the components of FIG. 13, and their detailed descriptions will therefore not be provided.

Referring to FIG. 14, the display panel according to an embodiment of the present disclosure may further include a barrier layer BRL. The barrier layer BRL may be disposed between the first to third color conversion layers CCL1 to CCL3. The barrier layer BRL may be disposed between pixel areas PXA1 to PXA3, i.e., may be disposed on (in) a non-pixel area NPXA. For example, the barrier layer BRL may be provided to define each of the pixel areas PXA1 to PXA3 or may be provided to define a pixel column having the same color. When the color conversion layers CCL1 to CCL3 are formed in an inkjet manner, a barrier layer BRL that partitions an area in which the color conversion layers CCL1 to CCL3 are defined may be provided.

The barrier layer BRL may overlap the light blocking layer BML on the plane (when viewed in a plan view). The barrier layer BRL may have a width in the first direction DR1 less than that of the light blocking layer BML. The barrier BRL may have a thickness (i.e., a height in the third direction) that is greater than or equal to that of each of the color conversion layers CCL1 to CCL3.

According to an embodiment of the present invention, the barrier layer BRL may include a material that is capable of absorbing the first color light to prevent (or reduce) colors from being mixed between the pixel areas PXA1 to PXA3.

According to an embodiment of the present disclosure, the second protection layer PL2 may cover the barrier layer BRL and the first to third color conversion layer CCL1 to CCL3.

According to the present disclosure, the light collection layer that collects the first color light may be disposed between the color conversion layer and the light emitting element layer to improve the light efficiency of the first color light outputted from the light emitting element layer, and also to prevent (or reduce) the colors from being mixed between the pixel areas, thereby improving the display quality.

Expressions such as "at least one of," "one of," and "selected from," when preceding a list of elements, modify the entire list of elements and do not modify the individual elements of the list.

As used herein, the terms "use," "using," and "used" may be considered synonymous with the terms "utilize," "utilizing," and "utilized," respectively.

As used herein, the singular forms "a," "an," and "the" are intended to include the plural forms as well, unless the context clearly indicates otherwise.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be apparent to those skilled in the art that various modifications and variations can be made in the present disclosure. Thus, it is intended that the present disclosure covers the modifications and variations of this invention provided they come within the scope of the appended claims and their equivalents.

Hence, the real protective scope of the present disclosure shall be determined by the technical scope of the accompanying claims.

What is claimed is:

1. A display device comprising:
   a light emitting element layer comprising a plurality of light emitting elements configured to output a first color light, a pixel defining layer defining a plurality of pixel areas and a non-pixel area, and an encapsulation layer sealing the plurality of light emitting elements and the pixel defining layer;
   a color conversion layer on the light emitting element layer to receive the first color light, the color conversion layer being configured to convert the first color light to output at least two lights having colors different from each other; and
   a light collection layer between the light emitting element layer and the color conversion layer to collect the first color light and to provide the collected first color light to the color conversion layer,
   wherein the light collection layer is directly disposed on the encapsulation layer and extends commonly on the plurality of light emitting elements, and
   the light collection layer overlaps with the pixel defining layer in the non-pixel area.

2. The display device of claim 1, wherein the light collection layer comprises a plurality of prism patterns configured to collect the first color light.

3. The display device of claim 2, wherein the light emitting element layer comprises first to third pixel areas,
   wherein the first to third pixel areas are spaced apart from each other in a first direction and arranged in a second direction crossing the first direction.

4. The display device of claim 3, wherein the plurality of prism patterns extend in the second direction and are arranged in the first direction, and
   each of the plurality of prism patterns is less in width than a corresponding pixel area of the first to third pixel areas.

5. The display device of claim 1, wherein the light emitting element layer comprises first to third pixel areas, and
   each of the plurality of light emitting elements is on a corresponding pixel area of the first to third pixel areas.

6. The display device of claim 5, wherein the light emitting element layer comprises a light emitting layer that is commonly on the plurality of light emitting elements, and
   the first color light is a blue light.

7. The display device of claim 6, wherein the color conversion layer comprises:
   a first color conversion layer corresponding to the first pixel area, the first color conversion layer being configured to convert a wavelength of the first color light to output a second color light; and
   a second color conversion layer corresponding to the second pixel area, the second color conversion layer being configured to convert a wavelength of the first color light to output a third color light.

8. The display device of claim 7, wherein the second color light is a red light, and
   the third color light is a green light.

9. The display device of claim 8, wherein the first color conversion layer comprises a red conversion material configured to convert the first color light into the red light, and
   the second conversion layer comprises a green conversion material configured to convert the first color light into the green light.

10. The display device of claim 9, wherein the red conversion material comprises a red quantum dot, and
    the green conversion material comprises a green quantum dot.

11. The display device of claim 7, wherein the color conversion layer further comprises a third color conversion layer corresponding to the third pixel area and configured to transmit the first color light therethrough.

12. The display device of claim 11, wherein each of the first to third color conversion layers further comprises a light scattering agent.

13. The display device of claim 11, further comprising a color filter layer on the color conversion layer.

14. The display device of claim 13, wherein the color filter layer comprises:
- a first color filter layer on the first color conversion layer to transmit the second color light therethrough;
- a second color filter layer on the second color conversion layer to transmit the third color light therethrough; and
- a third color filter layer on the third color conversion layer to transmit the first color light therethrough.

15. The display device of claim 14, further comprising:
- a first protection layer between the color conversion layer and the light collection layer; and
- a second protection layer between the color filter layer and the color conversion layer.

16. The display device of claim 14, further comprising a light blocking layer between any two of the first to third color filter layers.

17. The display device of claim 11, further comprising a barrier layer between any two of the first to third color conversion layers.

18. The display device of claim 1, further comprising:
- a first base layer on which the light emitting element layer is disposed; and
- a second base layer on the color conversion layer.

19. The display device of claim 1, further comprising:
- a protection layer on the light collection layer, between the light collection layer and the color conversion layer,
- wherein the light collection layer comprises an acrylic resin, and
- the protection layer comprises at least one of silicon nitride, aluminum nitride, zirconium nitride, titanium nitride, hafnium nitride, aluminum oxide, titanium oxide, tin oxide, cesium oxide, or silicon oxynitride.

* * * * *